United States Patent
Dyvorne et al.

(10) Patent No.: US 11,422,216 B2
(45) Date of Patent: *Aug. 23, 2022

(54) GRADIENT WAVEFORM DESIGN FOR LOW-FIELD MAGNETIC RESONANCE IMAGING SYSTEMS

(71) Applicant: Hyperfine Operations, Inc., Guilford, CT (US)

(72) Inventors: Hadrien A. Dyvorne, New York, NY (US); Laura Sacolick, Guilford, CT (US); Rafael O'Halloran, Guilford, CT (US); Carole Lazarus, Paris (FR); Michael Twieg, New Haven, CT (US)

(73) Assignee: Hyperfine Operations, Inc., Guilford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/210,374

(22) Filed: Mar. 23, 2021

(65) Prior Publication Data

US 2021/0302519 A1    Sep. 30, 2021

Related U.S. Application Data

(60) Provisional application No. 62/994,001, filed on Mar. 24, 2020.

(51) Int. Cl.
  *G01R 33/385*  (2006.01)
  *G01R 33/383*  (2006.01)
  (Continued)

(52) U.S. Cl.
  CPC ....... *G01R 33/3852* (2013.01); *G01R 33/383* (2013.01); *G01R 33/445* (2013.01); *G01R 33/543* (2013.01)

(58) Field of Classification Search
  USPC .......................................................... 324/309
  See application file for complete search history.

(56) References Cited

U.S. PATENT DOCUMENTS 9,817,093 B2    11/2017    Rothberg et al.
10,545,207 B2    1/2020    Poole et al.
(Continued)

FOREIGN PATENT DOCUMENTS

WO    WO 2019/231427 A1    12/2019

OTHER PUBLICATIONS

International Search Report and Written Opinion for International Application No. PCT/US2021/023713 dated Aug. 27, 2021.
(Continued)

*Primary Examiner* — Rodney E Fuller
(74) *Attorney, Agent, or Firm* — Wolf, Greenfield & Sacks, P.C.

(57) ABSTRACT

Systems and methods for generating a gradient waveform for use by a low-field MRI system to generate a gradient magnetic field are provided herein. The gradient waveform can be determined using first information indicative of the gradient waveform and second information indicative of hardware constraints of the low-field MRI system including a maximum voltage of the gradient power amplifier, a maximum slew rate of the gradient coil, a resistance of the gradient coil, and an inductance of the gradient coil. In some embodiments, the gradient waveform can be a trapezoidal gradient waveform determined to have a non-linear ramp-up portion and/or a non-linear ramp-down portion.

20 Claims, 14 Drawing Sheets

(51) Int. Cl.
    *G01R 33/44*     (2006.01)
    *G01R 33/54*     (2006.01)

(56) References Cited

U.S. PATENT DOCUMENTS

| | | |
|---|---|---|
| 10,890,634 B2 | 1/2021 | Dyvorne et al. |
| 2005/0077895 A1 | 4/2005 | Hargreaves et al. |
| 2007/0156042 A1 | 7/2007 | Unal |
| 2016/0069968 A1 | 3/2016 | Rothberg et al. |
| 2018/0238980 A1 | 8/2018 | Poole et al. |
| 2019/0353723 A1 | 11/2019 | Dyvorne et al. |
| 2020/0209334 A1 | 7/2020 | O'Halloran et al. |
| 2021/0048498 A1 | 2/2021 | Dyvorne et al. |
| 2021/0302518 A1* | 9/2021 | Dyvorne .............. G01R 33/385 |
| 2021/0373107 A1* | 12/2021 | Dyvorne ............ G01R 33/3607 |

OTHER PUBLICATIONS

Invitation to Pay Additional Fees for International Application No. PCT/US2021/023713 dated Jul. 2, 2021.
Hargreaves et al., Time-optimal multidimensional gradient waveform design for rapid imaging. Magnetic Resonance in Medicine: An Official Journal of the International Society for Magnetic Resonance in Medicine. Jan. 2004;51(1):81-92.
Spielman et al., Spiral imaging on a small-bore system at 4.7 T. Magnetic resonance in medicine. Oct. 1995;34(4):580-5.
Lustig et al., A fast method for designing time-optimal gradient waveforms for arbitrary k-space trajectories. IEEE transactions on medical imaging. May 28, 2008;27(6):866-73.

\* cited by examiner

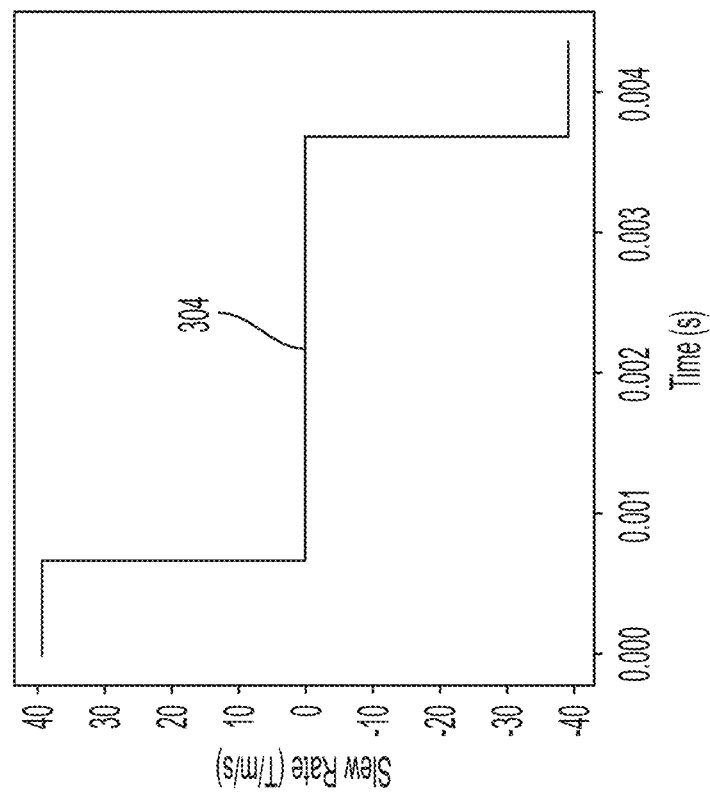
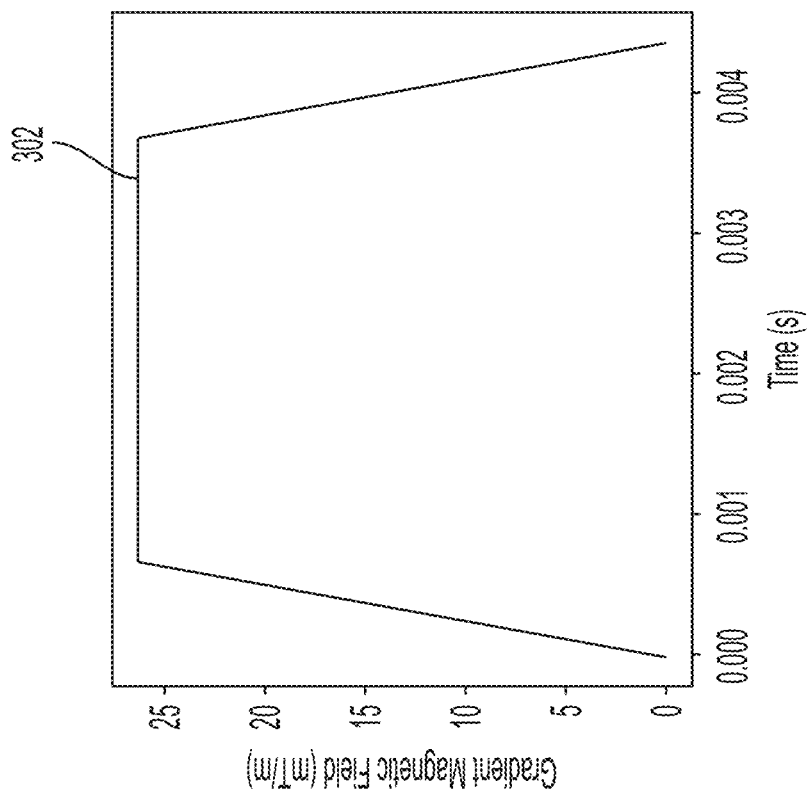
FIG. 3B
FIG. 3A

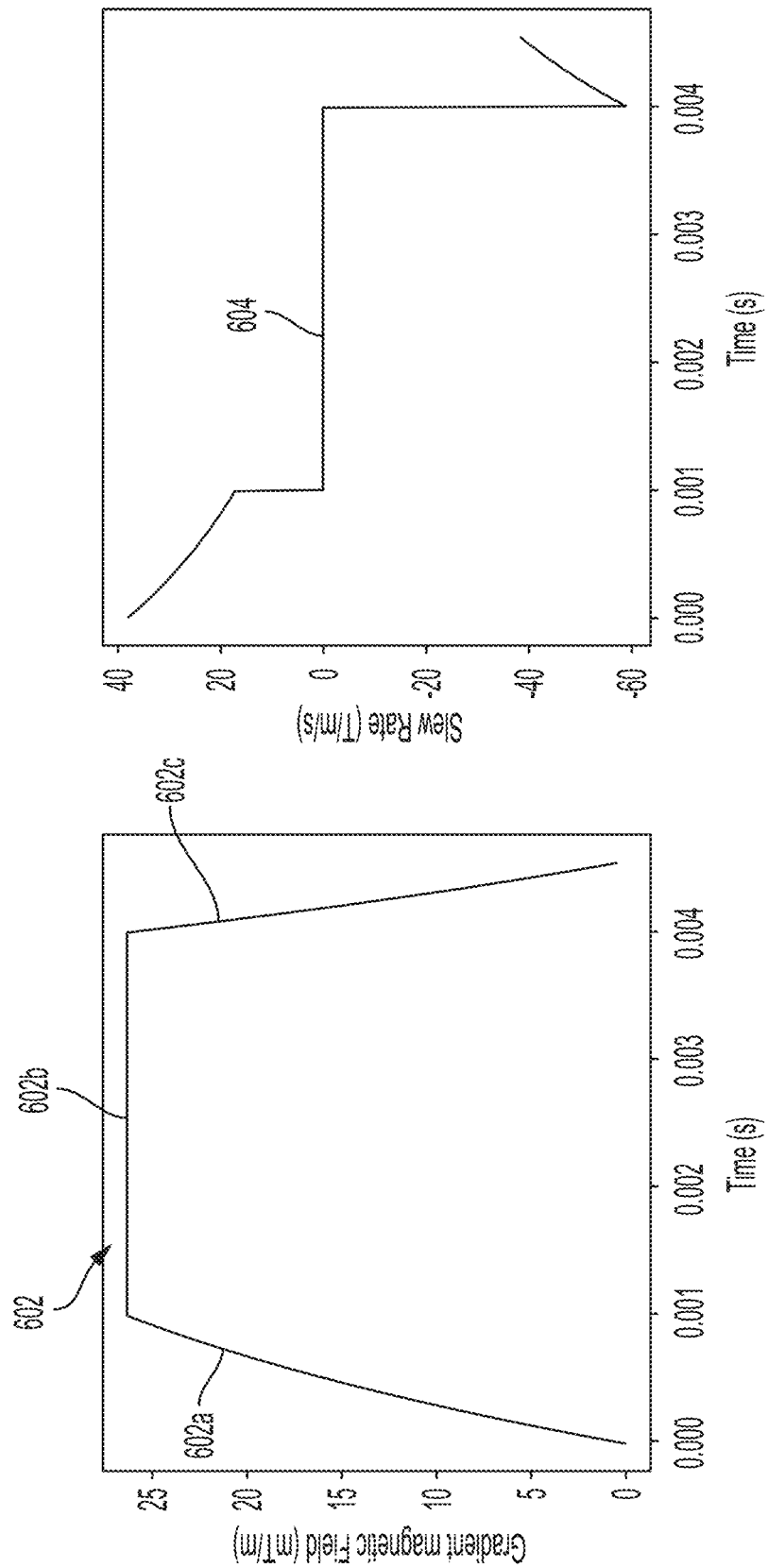

GRADIENT WAVEFORM DESIGN FOR LOW-FIELD MAGNETIC RESONANCE IMAGING SYSTEMS

CROSS REFERENCE TO RELATED APPLICATIONS

This application claims priority under 35 U.S.C. § 119(e) to U.S. Provisional Patent Application Ser. No. 62/994,001, titled "GRADIENT WAVEFORM DESIGN FOR LOW-FIELD MAGNETIC RESONANCE IMAGING SYSTEMS", filed on Mar. 24, 2020, which is incorporated by reference in its entirety herein.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, prognostic, therapeutic, and/or research purposes.

SUMMARY

Some embodiments are directed to a method of generating a gradient waveform for use by a low-field magnetic resonance imaging (MRI) system to generate a gradient magnetic field, the low-field MRI system comprising a gradient coil and a gradient power amplifier for driving the gradient coil. The method comprises accessing first information indicative of the gradient waveform; accessing second information indicative of hardware constraints of the low-field MRI system, the second information including information indicative of a maximum voltage of the gradient power amplifier, a maximum slew rate of the gradient coil, a resistance of the gradient coil, and an inductance of the gradient coil; determining the gradient waveform using the first information and the second information; and generating the gradient waveform.

Some embodiments are directed to at least one non-transitory computer-readable storage medium storing processor-executable instructions that, when executed by a low-field MRI system, cause the low-field MRI system to perform a method of generating a gradient waveform for use by the low-field MRI system to generate a gradient magnetic field, the low-field MRI system comprising a gradient coil and a gradient power amplifier for driving the gradient coil. The method comprises accessing first information indicative of the gradient waveform; accessing second information indicative of hardware constraints of the low-field MRI system, the second information including information indicative of a maximum voltage of the gradient power amplifier, a maximum slew rate of the gradient coil, a resistance of the gradient coil, and an inductance of the gradient coil; determining the gradient waveform using the first information and the second information; and generating the gradient waveform.

Some embodiments are directed to a low-field MRI system. The low-field MRI system comprises a magnetics system comprising a plurality of magnetics components configured to produce magnetic fields for performing magnetic resonance imaging, the plurality of magnetics components comprising a gradient coil and a gradient power amplifier for driving the gradient coil; and at least one controller configured to operate one or more of the plurality of magnetics components. The at least one controller is configured to access first information indicative of the gradient waveform; access second information indicative of hardware constraints of the low-field MRI system, the second information including information indicative of a maximum voltage of the gradient power amplifier, a maximum slew rate of the gradient coil, a resistance of the gradient coil, and an inductance of the gradient coil; determine the gradient waveform using the first information and the second information; and generate the gradient waveform.

In some embodiments, the method further comprises generating the gradient magnetic field by using the gradient power amplifier and the gradient waveform to drive the gradient coil.

In some embodiments, determining the gradient waveform is performed using a ratio of the resistance of the gradient coil and the inductance of the gradient coil.

In some embodiments, determining the gradient waveform comprises determining gradient waveform parameters subject to hardware constraints specified using a differential equation, the differential equation specified in part using the second information. In some embodiments, determining the gradient waveform comprises solving the differential equation explicitly or numerically.

In some embodiments, accessing the first information comprises accessing information including a moment of the gradient magnetic field, a duration of the gradient magnetic field, and/or a maximum value of the gradient magnetic field.

In some embodiments, accessing the first information comprises accessing a pre-determined gradient waveform.

In some embodiments, the method further comprises, after determining the gradient waveform, rotating a frame of reference of the gradient waveform to match a frame of reference of the low-field MRI system.

In some embodiments, the gradient waveform is a trapezoidal gradient waveform having a ramp-up portion, a top portion, and a ramp-down portion. In some embodiments, determining the gradient waveform comprises determining a shape of the ramp-up portion and/or the ramp-down portion using the first information and the second information.

In some embodiments, the maximum slew rate has a magnitude in a range from 10 T/m/s to 80 T/m/s. In some embodiments, the maximum slew rate has a magnitude in a range from 25 T/m/s to 65 T/m/s.

In some embodiments, the maximum voltage of the gradient power amplifier has a magnitude in a range from 20 V to 120 V. In some embodiments, the maximum voltage of the gradient power amplifier has a magnitude in a range from 40 V to 60 V.

In some embodiments, the low-field MRI system further comprises at least one permanent magnet configured to generate a $B_0$ magnetic field having a strength less than 0.2 T.

In some embodiments, the low-field MRI system further comprises at least one permanent magnet configured to generate a $B_0$ magnetic field having a strength in a range from 50 mT to 0.1 T.

Some embodiments are directed to a method of generating a gradient waveform for use by a low-field magnetic resonance imaging (MRI) system to generate a gradient magnetic field, the low-field MRI system comprising a gradient coil and a gradient power amplifier for driving the gradient coil. The method comprises accessing first information indicative of the gradient waveform; accessing second information indicative of hardware constraints of the low-field MRI system; determining the gradient waveform using the first information and the second information, wherein the gradient waveform is a trapezoidal gradient waveform having a non-linear ramp-up portion and/or a non-linear ramp-down portion; and generating the gradient waveform.

Some embodiments are directed to at least one non-transitory computer-readable storage medium storing processor-executable instructions that, when executed by a low-field MRI system, cause the low-field MRI system to perform a method of generating a gradient waveform for use by the low-field MRI system to generate a gradient magnetic field, the low-field MRI system comprising a gradient coil and a gradient power amplifier for driving the gradient coil. The method comprises accessing first information indicative of the gradient waveform; accessing second information indicative of hardware constraints of the low-field MRI system; determining the gradient waveform using the first information and the second information, wherein the gradient waveform is a trapezoidal gradient waveform having a non-linear ramp-up portion and/or a non-linear ramp-down portion; and generating the gradient waveform.

Some embodiments are directed to a low-field MRI system. The low-field MRI system comprises a magnetics system comprising a plurality of magnetics components configured to produce magnetic fields for performing magnetic resonance imaging, the plurality of magnetics components comprising a gradient coil and a gradient power amplifier for driving the gradient coil; and at least one controller configured to operate one or more of the plurality of magnetics components. The at least one controller is configured to access first information indicative of the gradient waveform; access second information indicative of hardware constraints of the low-field MRI system; determine the gradient waveform using the first information and the second information, wherein the gradient waveform is a trapezoidal gradient waveform having a non-linear ramp-up portion and/or a non-linear ramp-down portion; and generate the gradient waveform.

In some embodiments, the method further comprises generating the gradient magnetic field by using the gradient power amplifier and the gradient waveform to drive the gradient coil.

In some embodiments, determining the gradient waveform comprises determining a shape of the ramp-up portion and/or the ramp-down portion using the first information and the second information.

In some embodiments, determining the gradient waveform comprises determining gradient waveform parameters subject to hardware constraints specified using a differential equation, the differential equation specified in part using the second information. In some embodiments, determining the gradient waveform comprises solving the differential equation explicitly or numerically.

In some embodiments, accessing the first information comprises accessing information including a moment of the gradient magnetic field, a duration of the gradient magnetic field, and/or a maximum value of the gradient magnetic field.

In some embodiments, accessing the first information comprises accessing a pre-determined gradient waveform.

In some embodiments, accessing the second information comprises accessing information indicative of a maximum voltage of the gradient power amplifier, a maximum slew rate of the gradient coil, a resistance of the gradient coil, and an inductance of the gradient coil.

In some embodiments, the maximum slew rate has a magnitude in a range from 10 T/m/s to 80 T/m/s. In some embodiments, the maximum slew rate has a magnitude in a range from 25 T/m/s to 65 T/m/s.

In some embodiments, the maximum voltage of the gradient power amplifier has a magnitude in a range from 20 V to 120 V. In some embodiments, the maximum voltage of the gradient power amplifier has a magnitude in a range from 40 V to 60 V.

In some embodiments, the method further comprises, after determining the gradient waveform, rotating a frame of reference of the gradient waveform to match a frame of reference of the low-field MRI system.

In some embodiments, the low-field MRI system further comprises at least one permanent magnet configured to generate a $B_0$ magnetic field having a strength less than 0.2 T.

In some embodiments, the low-field MRI system further comprises at least one permanent magnet configured to generate a $B_0$ magnetic field having a strength in a range from 50 mT to 0.1 T.

Some embodiments are directed to a method of generating a gradient waveform for use by a low-field magnetic resonance imaging (MRI) system to generate a gradient magnetic field, the low-field MRI system comprising a gradient coil and a gradient power amplifier for driving the gradient coil. The method comprises accessing first information indicative of the gradient waveform; accessing second information indicative of hardware constraints of the low-field MRI system, the second information including information indicative of a maximum voltage of the gradient power amplifier, a maximum slew rate of the gradient coil, and/or a voltage induced in the gradient coil in response to an applied current; determining the gradient waveform using the first information and the second information; and generating the gradient waveform.

Some embodiments are directed to at least one non-transitory computer-readable storage medium storing processor-executable instructions that, when executed by a low-field MRI system, cause the low-field MRI system to perform a method of generating a gradient waveform for use by the low-field MRI system to generate a gradient magnetic field, the low-field MRI system comprising a gradient coil and a gradient power amplifier for driving the gradient coil. The method comprises accessing first information indicative of the gradient waveform; accessing second information indicative of hardware constraints of the low-field MRI system, the second information including information indicative of a maximum voltage of the gradient power amplifier, a maximum slew rate of the gradient coil, and/or a voltage induced in the gradient coil in response to an applied current; determining the gradient waveform using the first information and the second information; and generating the gradient waveform.

Some embodiments are directed to a low-field MRI system. The low-field MRI system comprises a magnetics system comprising a plurality of magnetics components configured to produce magnetic fields for performing magnetic resonance imaging, the plurality of magnetics components comprising a gradient coil and a gradient power amplifier for driving the gradient coil; and at least one controller configured to operate one or more of the plurality of magnetics components. The at least one controller is configured to access first information indicative of the gradient waveform; access second information indicative of hardware constraints of the low-field MRI system, the second information including information indicative of a maximum voltage of the gradient power amplifier, a maximum slew rate of the gradient coil, and/or a voltage induced in the gradient coil in response to an applied current; determine the gradient waveform using the first information and the second information; and generate the gradient waveform.

In some embodiments, the method further comprises generating the gradient magnetic field by using the gradient power amplifier and the gradient waveform to drive the gradient coil.

In some embodiments, determining the gradient waveform is performed using a ratio of the resistance of the gradient coil and the inductance of the gradient coil.

In some embodiments, determining the gradient waveform comprises determining gradient waveform parameters subject to hardware constraints specified using a differential equation, the differential equation specified in part using the second information. In some embodiments, determining the gradient waveform comprises solving the differential equation explicitly or numerically.

In some embodiments, accessing the first information comprises accessing information including a moment of the gradient magnetic field, a duration of the gradient magnetic field, and/or a maximum value of the gradient magnetic field.

In some embodiments, accessing the first information comprises accessing a pre-determined gradient waveform.

In some embodiments, the method further comprises, after determining the gradient waveform, rotating a frame of reference of the gradient waveform to match a frame of reference of the low-field MRI system.

In some embodiments, the gradient waveform is a trapezoidal gradient waveform having a ramp-up portion, a top portion, and a ramp-down portion. In some embodiments, determining the gradient waveform comprises determining a shape of the ramp-up portion and/or the ramp-down portion using the first information and the second information.

In some embodiments, the maximum slew rate has a magnitude in a range from 10 T/m/s to 80 T/m/s. In some embodiments, the maximum slew rate has a magnitude in a range from 25 T/m/s to 65 T/m/s.

In some embodiments, the maximum voltage of the gradient power amplifier has a magnitude in a range from 20 V to 120 V. In some embodiments, the maximum voltage of the gradient power amplifier has a magnitude in a range from 40 V to 60 V.

In some embodiments, the low-field MRI system further comprises at least one permanent magnet configured to generate a $B_0$ magnetic field having a strength less than 0.2 T.

In some embodiments, the low-field MRI system further comprises at least one permanent magnet configured to generate a $B_0$ magnetic field having a strength in a range from 50 mT to 0.1 T.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

FIG. 3A is a plot of an illustrative gradient waveform including a trapezoidal gradient pulse having linear ramp-up and ramp-down portions.

FIG. 3B is a plot of a magnetic slew rate corresponding to the gradient waveform of FIG. 3A.

FIG. 6A is a plot of an illustrative gradient waveform including a trapezoidal gradient pulse having non-linear ramp-up and ramp-down portions, in accordance with some embodiments of the technology described herein.

FIG. 6B, is a plot of a magnetic slew rate corresponding to the gradient waveform of FIG. 6A, in accordance with some embodiments of the technology described herein.

DETAILED DESCRIPTION

Figure 1:
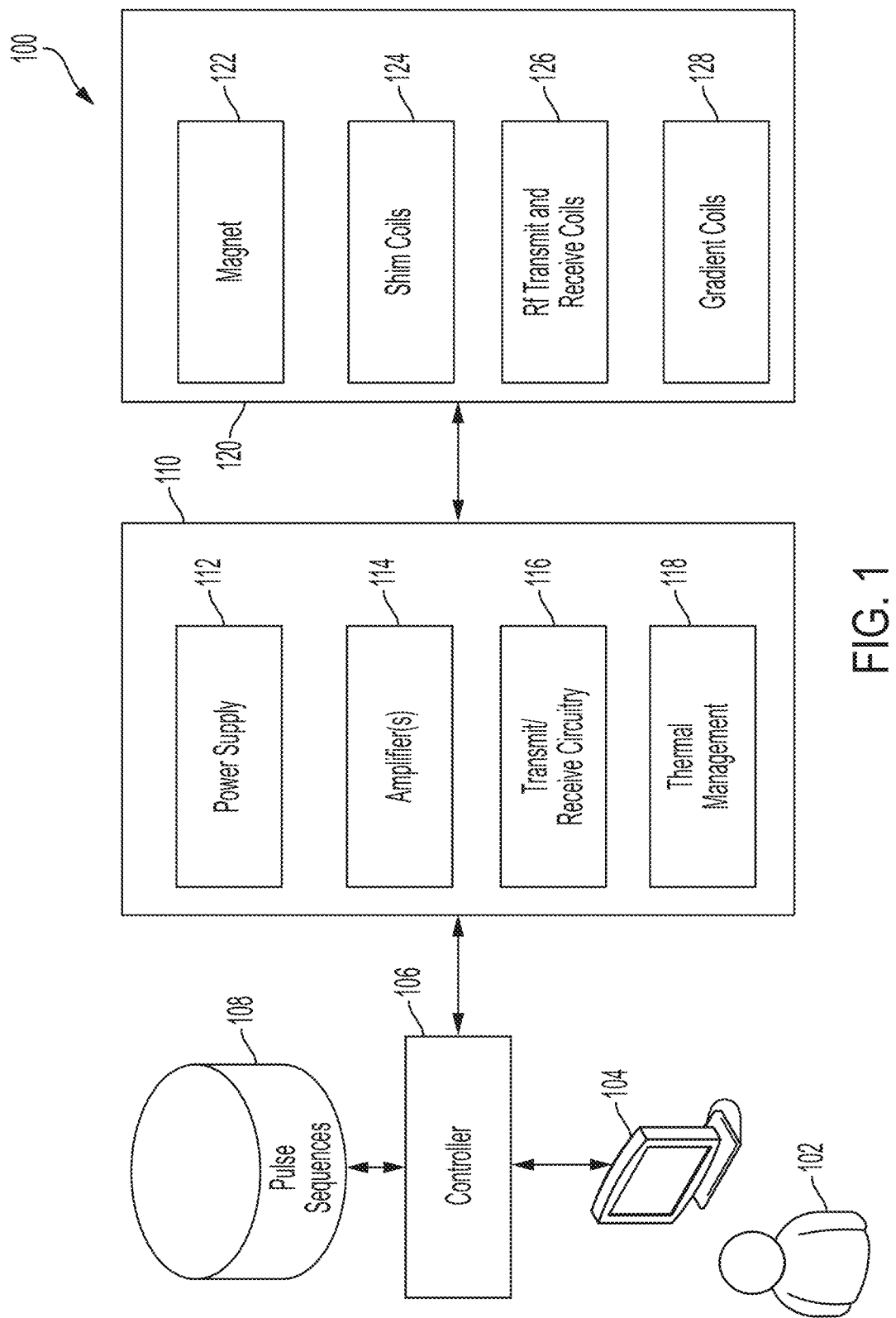
FIG. 1 illustrates exemplary components of a magnetic resonance imaging (MRI) system, in accordance with some embodiments of the technology described herein.

As described above, magnetic resonance imaging (MRI) is based on detecting magnetic resonance (MR) signals from spins associated with a subject, which are electromagnetic waves emitted by atoms in response to state changes resulting from applied electromagnetic fields. Accordingly, to acquire an MR image, an MRI system generates time-varying gradient magnetic fields to spatially encode MR signals within the subject as well as radio frequency (RF) signals to excite MR responses from spins within the subject. These time-varying gradient magnetic fields are typically generated by using gradient power amplifiers (GPAs) to drive electromagnets (e.g., gradient coils) according to gradient waveforms. A gradient waveform specifies, for a period of time, the desired amplitude, direction, and slew rate(s) (e.g., a rate-of-change of the gradient magnetic field over time) of the gradient magnetic field to be generated using the gradient waveform.

Conventional high-field MRI systems are powered by high-voltage, high-current dedicated power systems, which are independent from the power supply of the building in which they are located. Additionally, the GPAs of such high-field MRI systems are engineered with high-voltage limits. These factors ensure that conventional high-field MRI systems can generate gradient waveforms without running into power (e.g., voltage, current) constraints or hardware constraints. Thus, gradient waveforms for high-field MRI systems are typically designed without considering these voltage, current, or other hardware constraints.

The inventors have recognized that, unlike conventional high-field MRI systems, portable, low-field MRI systems have to operate under power and hardware constraints. For example, a low-field MRI system may be designed to operate using power from a standard wall outlet (e.g., mains electricity) that provides a relatively low voltage output (e.g., 230 V or 240 V outputs). The GPAs of a low-field MRI system may accordingly be limited in their voltage output (e.g., to a voltage in the range from 20 V to 120 V, or from 40 V to 60 V).

The inventors have recognized that conventional gradient waveforms designed for high-field MRI systems are not ideal for use by low-field MRI systems because of the power and hardware constraints faced by low-field MRI systems. Operating low-field MRI systems using gradient waveforms that are designed for conventional, high-field MRI systems can result in undesirable effects including distortions in the generated gradient magnetic field. These distortions in the generated gradient magnetic field can result in artefacts appearing in the collected magnetic resonance (MR) images. Such artefacts reduce the MR image quality and clinical utility of MR images acquired using low-field MRI systems.

For example, trapezoidal gradient waveforms with fast, linear slew rates, when used by the GPAs of a low-field MRI system to drive one or more gradient coils, may cause the GPAs to enter into a voltage overshoot regime and distort the generated gradient magnetic field. While one approach to addressing this issue in a low-field context may be to decrease the slew rate to remain within hardware limits, doing so would decrease the amount of time spent collecting MR signal data at the desired gradient field, thereby reducing MR image quality. The inventors have accordingly developed techniques to generate trapezoidal gradient waveforms with fast, non-linear ramp-up and ramp-down portions (e.g., such that these portions have a variable slew rate over time). By using a non-linear slew rate, the gradient waveform may reach the desired gradient field more quickly without violating hardware constraints.

Accordingly, the techniques described herein and developed by the inventors provide for the design of time-efficient gradient waveforms that may be used to generate gradient fields in low-field MRI systems within the power and hardware constraints of said low-field MRI systems. The techniques described herein include optimization techniques that account for gradient coil characteristics in the design of gradient waveforms for use by low-field MRI systems. For example, the optimization techniques can prevent the GPAs from entering a voltage overshoot regime by accounting for the voltage in the gradient coils during operation of the low-field MRI system. For example, the voltage produced in a gradient coil due to an applied current can be expressed as a function of the gradient coil's resistance and inductance. Using gradient coil parameters such as the gradient coil's resistance and/or inductance to design the gradient waveforms can therefore prevent the gradient waveforms from exceeding power and/or hardware constraints of the low-field MRI system.

Accordingly, some embodiments provide for techniques of generating a gradient waveform for use by a low-field MRI system to generate a gradient magnetic field, the low-field MRI system including a gradient coil and a GPA for driving the gradient coil using the gradient waveform. The techniques include: (1) accessing information indicative of the gradient waveform and information indicative of hardware constraints of the low-field MRI system; (2) determining the gradient waveform using the information indicative of the gradient waveform and the information indicative of hardware constraints; and (3) generating the gradient waveform (e.g., by generating information specifying parameters of the gradient waveform and/or by generating a signal carrying the information specifying parameters of the gradient waveform). The generated gradient waveform may then be stored (e.g., in computer memory) and/or used to generate a gradient magnetic field by using the GPA and the gradient waveform to drive the gradient coil of the low-field MRI system. The gradient waveform may be any suitable gradient waveform for use by an MRI system to generate a gradient magnetic field (e.g., a trapezoidal gradient waveform, a square gradient waveform, a gradient waveform associated with a spiral k-space trajectory, etc.).

In some embodiments, the information indicative of the gradient waveform includes parameters of the gradient waveform. For example, the parameters may include a moment of the gradient magnetic field, a duration of the gradient magnetic field, and/or a maximum value of the gradient magnetic field. Alternatively, the information indicative of the gradient waveform may be a pre-determined gradient waveform having specified parameters such as a specified moment, duration, and/or maximum value of the gradient magnetic field to be generated.

In some embodiments, the information indicative of hardware constraints of the low-field MRI system includes parameters associated with hardware constraints of the gradient coil and/or GPA of the low-field MRI system. For example, the information may include a maximum voltage of the GPA, a maximum slew rate of the gradient coil (e.g., a maximum rate-of-change of the gradient magnetic field), a resistance of the gradient coil, and/or an inductance of the gradient coil. In some embodiments, the maximum slew rate has a magnitude in a range from 10 T/m/s to 80, T/m/s, in a range from 15 T/m/s to 70 T/m/s, in a range from 15 T/m/s to 60 T/m/s, in a range from 20 T/m/s to 65 T/m/s, in a range from 25 T/m/s to 65 T/m/s, and/or in any suitable range within those ranges. In some embodiments, the maximum voltage of the gradient power amplifier has a magnitude in a range from 20V to 120V, in a range from 25 V to 100 V, in a range from 30 V to 75 V, in a range from 40 V to 60 V, and/or in any suitable range within those ranges.

In some embodiments, determining the gradient waveform comprises determining gradient waveform parameters (e.g., slew rates, gradient magnetic field amplitudes and/or durations, etc.) subject to hardware constraints. For example, determining the gradient waveform is performed using a ratio of the resistance of the gradient coil and the inductance of the gradient coil. In some embodiments, the hardware constraints used to determine the gradient waveform may be specified using a differential equation. The differential equation may be defined in part using the information indicative of the hardware constraints of the low-field MRI system. In some embodiments, determining the gradient waveform is performed by solving the differential equation (e.g., explicitly or numerically solving the differential equation).

In some embodiments, the gradient waveform is a trapezoidal gradient waveform including a non-linear ramp-up portion and/or a non-linear ramp-down portion. In such embodiments, determining the gradient waveform includes determining a shape of the ramp-up portion and/or the ramp-down portion using the information indicative of the gradient waveform and the information indicative of the hardware constraints of the low-field MRI system.

In some embodiments, after determining the gradient waveform, the method includes rotating a frame of reference of the gradient waveform. Rotating the frame of reference of the gradient waveform may be performed to match a frame of reference of the low-field MRI system and/or the subject (e.g., the patient) being imaged by the low-field MRI system. Rotating the frame of reference of the gradient waveform may be performed, for example, by applying a transformation (e.g., a rotation)) to the gradient waveform (e.g., by applying a rotation matrix to the gradient waveform.

Aspects of such calculations are described in J. Maclaren, M. Herbst, O. Speck, and M. Zaitsev, "Prospective motion correction in brain imaging: A review", Magnetic Resonance in Medicine, Volume 69, Issue 23, Mar. 1, 2013, pp. 621-636, which is incorporated by reference herein in its entirety. Additional description of techniques related to applying a transformation to a gradient waveform are described in U.S. patent application Ser. No. 17/078,660, titled "Artefact Reduction in Magnetic Resonance Imaging" and filed on Oct. 23, 2020, which is incorporated by reference herein in its entirety.

Following below are more detailed descriptions of various concepts related to, and embodiments of, techniques for eddy current correction. It should be appreciated that various aspects described herein may be implemented in any of numerous ways. Examples of specific implementations are provided herein for illustrative purposes only. In addition, the various aspects described in the embodiments below may be used alone or in any combination and are not limited to the combinations described explicitly herein.

As used herein, "high-field" refers generally to MRI systems presently in use in a clinical setting and, more particularly, to MRI systems operating with a main magnetic field (i.e., a $B_0$ field) at or above 1.5 T, though clinical systems operating between 0.5 T and 1.5 T are often also characterized as "high-field." Field strengths between approximately 0.2 T and 0.5 T have been characterized as "mid-field" and, as field strengths in the high-field regime have continued to increase, field strengths in the range between 0.5 T and 1 T have also been characterized as mid-field. By contrast, "low-field" refers generally to MRI systems operating with a $B_0$ field of less than or equal to approximately 0.2 T, though systems having a $B_0$ field of between 0.2 T and approximately 0.3 T have sometimes been characterized as low-field as a consequence of increased field strengths at the high end of the high-field regime. Within the low-field regime, low-field MRI systems operating with a $B_0$ field of less than 0.1 T are referred to herein as "very low-field" and low-field MRI systems operating with a $B_0$ field of less than 10 mT are referred to herein as "ultra-low field."

FIG. 1 illustrates exemplary components of a magnetic resonance imaging (MRI) system, in accordance with some embodiments. In the illustrative example of FIG. 1, MRI system 100 comprises computing device 104, controller 106, pulse sequences repository 108, power management system 110, and magnetics components 120. It should be appreciated that system 100 is illustrative and that an MRI system may have one or more other components of any suitable type in addition to or instead of the components illustrated in FIG. 1. However, an MRI system will generally include these high-level components, though the implementation of these components for a particular MRI system may differ. It may be appreciated that the techniques described herein for eddy current compensation may be used with any suitable type of MRI systems including high-field MRI systems, low-field MRI systems, and ultra-low field MRI systems. For example, the techniques described herein may be used with any of the MRI systems described herein and/or as described in U.S. Pat. No. 10,627,464 filed Jun. 30, 2017 and titled "Low-Field Magnetic Resonance Imaging Methods and Apparatus," which is incorporated by reference herein in its entirety.

As illustrated in FIG. 1, magnetics components 120 comprise $B_0$ magnets 122, shim coils 124, radio frequency (RF) transmit and receive coils 126, and gradient coils 128. $B_0$ magnets 122 may be used to generate the main magnetic field $B_0$. $B_0$ magnets 122 may be any suitable type or combination of magnetics components that can generate a desired main magnetic $B_0$ field. In some embodiments, $B_0$ magnets 122 may be a permanent magnet, an electromagnet, a superconducting magnet, or a hybrid magnet comprising one or more permanent magnets and one or more electromagnets and/or one or more superconducting magnets. In some embodiments, $B_0$ magnets 122 may be configured to generate a $B_0$ magnetic field having a field strength that is less than or equal to 0.2 T or within a range from 50 mT to 0.1 T.

For example, in some embodiments, $B_0$ magnets 122 may include a first and second $B_0$ magnet, each of the first and second $B_0$ magnet including permanent magnet blocks arranged in concentric rings about a common center. The first and second $B_0$ magnet may be arranged in a bi-planar configuration such that the imaging region is located between the first and second $B_0$ magnets. In some embodiments, the first and second $B_0$ magnets may each be coupled to and supported by a ferromagnetic yoke configured to capture and direct magnetic flux from the first and second $B_0$ magnets. Additional details of such embodiments are described in U.S. Pat. No. 10,545,207 titled "Low-Field magnetic Resonance Imaging Methods and Apparatus" filed on Apr. 18, 2018, which is incorporated by reference herein in its entirety.

Gradient coils 128 may be arranged to provide gradient fields and, for example, may be arranged to generate gradients in the $B_0$ field in three substantially orthogonal directions (X, Y, Z). Gradient coils 128 may be configured to encode emitted MR signals by systematically varying the $B_0$ field (the $B_0$ field generated by $B_0$ magnets 122 and/or shim coils 124) to encode the spatial location of received MR signals as a function of frequency or phase. For example, gradient coils 128 may be configured to vary frequency or phase as a linear function of spatial location along a particular direction, although more complex spatial encoding profiles may also be provided by using nonlinear gradient coils. In some embodiments, gradient coils 128 may be implemented using laminate panels (e.g., printed circuit boards). Examples of such gradient coils are described in U.S. Pat. No. 9,817,093 titled "Low Field Magnetic Resonance Imaging Methods and Apparatus" filed on Sep. 4, 2015, which is incorporated by reference herein in its entirety.

MRI is performed by exciting and detecting emitted MR signals using transmit and receive coils, respectively (often referred to as radio frequency (RF) coils). Transmit/receive coils may include separate coils for transmitting and receiving, multiple coils for transmitting and/or receiving, or the same coils for transmitting and receiving. Thus, a transmit/receive component may include one or more coils for transmitting, one or more coils for receiving and/or one or more coils for transmitting and receiving. Transmit/receive coils are also often referred to as Tx/Rx or Tx/Rx coils to generically refer to the various configurations for the transmit and receive magnetics component of an MRI system. These terms are used interchangeably herein. In FIG. 1, RF transmit and receive circuitry 116 comprises one or more transmit coils that may be used to generate RF pulses to induce an oscillating magnetic field $B_1$. The transmit coil(s) may be configured to generate any suitable types of RF pulses. The transmit and receive circuitry 116 may include additional electronic components of the transmit and receive chains, as described in U.S. Pat. No. 10,890,634 titled "Radio-Frequency Coil Signal Chain for a Low-Field MRI System" and filed on May 21, 2019, which is hereby incorporated by reference in its entirety.

Power management system 110 includes electronics to provide operating power to one or more components of the low-field MRI system 100. For example, power management system 110 may include one or more power supplies, energy storage devices, gradient power components, transmit coil components, and/or any other suitable power electronics needed to provide suitable operating power to energize and operate components of MRI system 100. As illustrated in FIG. 1, power management system 110 comprises power supply system 112, amplifier(s) 114, transmit and receive circuitry 116, and thermal management components 118 (e.g., cryogenic cooling equipment for superconducting magnets, water cooling equipment for electromagnets).

Power supply system 112 includes electronics to provide operating power to magnetics components 120 of the MRI system 100. The electronics of power supply system 112 may provide, for example, operating power to one or more gradient coils (e.g., gradient coils 128) to generate one or more gradient magnetic fields to provide spatial encoding of the MR signals. Additionally, the electronics of power supply system 112 may provide operating power to one or more RF coils (e.g., RF transmit and receive coils 126) to generate and/or receive one or more RF signals from the subject. For example, power supply system 112 may include a power supply configured to provide power from mains electricity to the MRI system and/or an energy storage device. The power supply may, in some embodiments, be an AC-to-DC power supply configured to convert AC power from mains electricity into DC power for use by the MRI system. The energy storage device may, in some embodiments, be any one of a battery, a capacitor, an ultracapacitor, a flywheel, or any other suitable energy storage apparatus that may bidirectionally receive (e.g., store) power from mains electricity and supply power to the MRI system. Additionally, power supply system 112 may include additional power electronics encompassing components including, but not limited to, power converters, switches, buses, drivers, and any other suitable electronics for supplying the MRI system with power.

Amplifiers(s) 114 may include one or more RF receive (Rx) pre-amplifiers that amplify MR signals detected by one or more RF receive coils (e.g., coils 126), one or more RF transmit (Tx) power components configured to provide power to one or more RF transmit coils (e.g., coils 126), one or more gradient power amplifiers (GPAs) configured to drive one or more gradient coils (e.g., gradient coils 128), and one or more shim power components configured to provide power to one or more shim coils (e.g., shim coils 124). Transmit and receive circuitry 116 may be used to select whether RF transmit coils or RF receive coils are being operated.

As illustrated in FIG. 1, MRI system 100 includes controller 106 (also referred to as a console) having control electronics to send instructions to and receive information from power management system 110. Controller 106 may be configured to implement one or more pulse sequences, which are used to determine the instructions sent to power management system 110 to operate the magnetics components 120 in a desired sequence (e.g., parameters for operating the RF transmit and receive coils 126, parameters for operating gradient coils 128, etc.). As illustrated in FIG. 1, controller 106 also interacts with computing device 104 programmed to process received MR data. For example, computing device 104 may process received MR data to generate one or more MR images using any suitable image reconstruction process(es). Controller 106 may provide information about one or more pulse sequences to computing device 104 for the processing of data by the computing device. For example, controller 106 may provide information about one or more pulse sequences to computing device 104 and the computing device may perform an image reconstruction process based, at least in part, on the provided information.

Computing device 104 may be any electronic device configured to process acquired MR data and generate one or more images of a subject being imaged. In some embodiments, computing device 104 may be located in a same room as the MRI system 100 and/or coupled to the MRI system 100. In some embodiments, computing device 104 may be a fixed electronic device such as a desktop computer, a server, a rack-mounted computer, or any other suitable fixed electronic device that may be configured to process MR data and generate one or more images of the subject being imaged. Alternatively, computing device 104 may be a portable device such as a smart phone, a personal digital assistant, a laptop computer, a tablet computer, or any other portable device that may be configured to process MR data and generate one or images of the subject being imaged. In some embodiments, computing device 104 may comprise multiple computing devices of any suitable type, as aspects of the disclosure provided herein are not limited in this respect.

Figure 2:
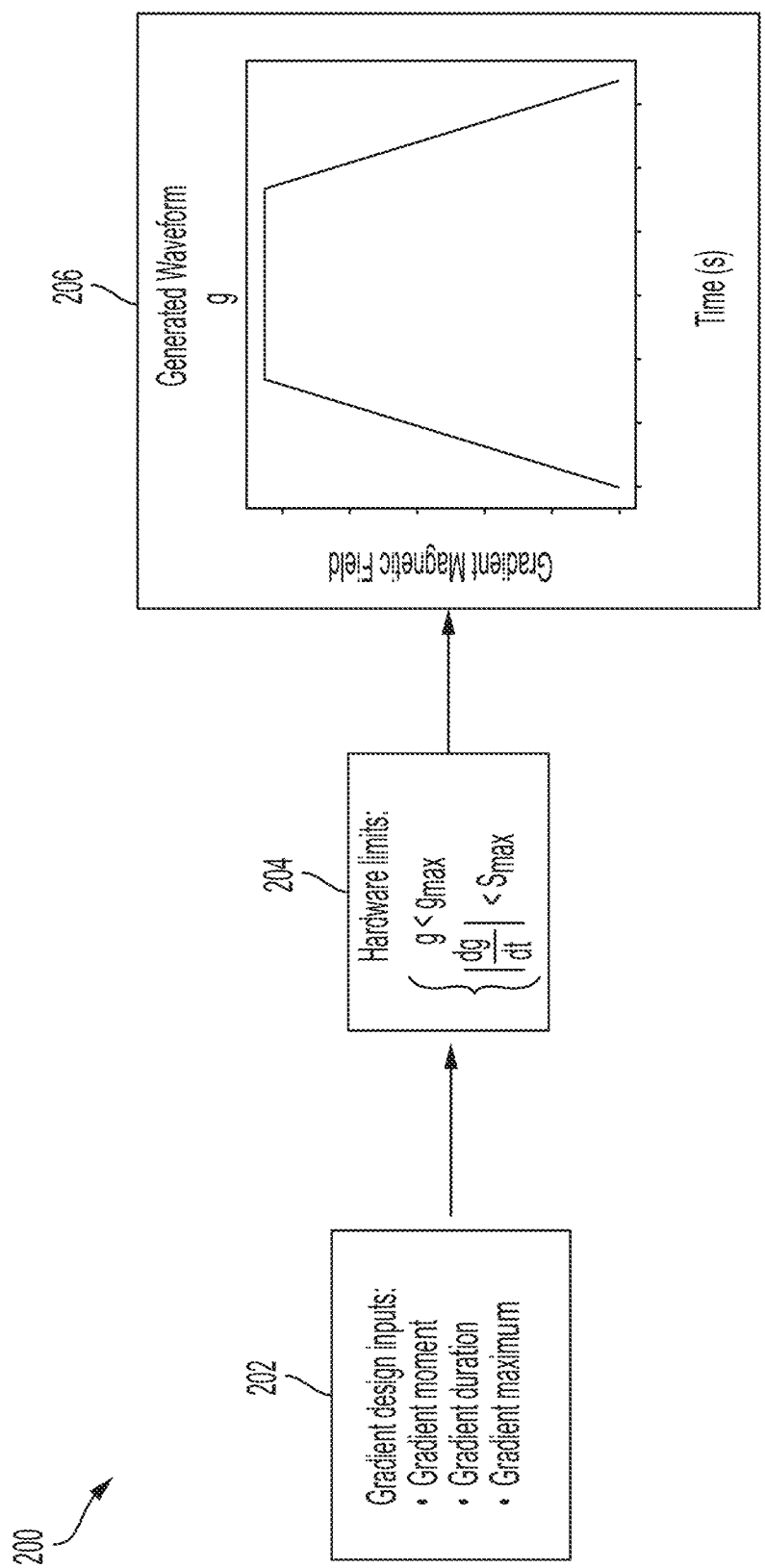
FIG. 2 is a flowchart illustrating a process 200 for generating a gradient waveform.

FIG. 2 is a flowchart describing a process 200 that may be used for generating a gradient waveform for use by a high-field MRI system. Process 200 includes accessing information indicative of the gradient waveform in act 202, accessing information indicative of gradient field constraints in act 204, and generating the gradient waveform in act 206. The gradient field constraints that are imposed in act 204 include:

$$\begin{cases} |g| < g_{max} \\ \left|\dfrac{dg}{dt}\right| < S_{max} \end{cases}$$

where g is the gradient magnetic field, $g_{max}$ is the maximum gradient magnetic field that can be generated by the gradient coil, dg/dt is the slew rate of the gradient magnetic field, and $S_{max}$ is the maximum slew rate that can be generated by the gradient coil when driven by an associated GPA.

These constraints limit the gradient magnetic field strength to being less than the maximum gradient field strength that can be generated by the gradient coil and limit the slew rate to being less than the maximum slew rate of the MRI system. As should be appreciated from FIG. 2, however, the above-described hardware constraints of act 204 do not depend on physical characteristics of the gradient coil (e.g., the resistance of the gradient coil, the inductance of the gradient coil, or the ratio of the inductance and resistance of the gradient coil). As a result, and as can be seen in the illustration of the generated gradient waveform in act 206, the ramp-up and ramp-down portions of the generated gradient waveform are linear.

FIG. 3A illustrates a gradient waveform generated using the process 200 described with reference to FIG. 2. The gradient waveform 302 includes a trapezoidal gradient pulse with linear ramp-up and ramp-down portions. The corresponding slew rate 304 is shown in FIG. 3B. The slew rate 304 is fixed for the ramp-up and ramp-down portions of the gradient waveform 302.

Figure 3D:
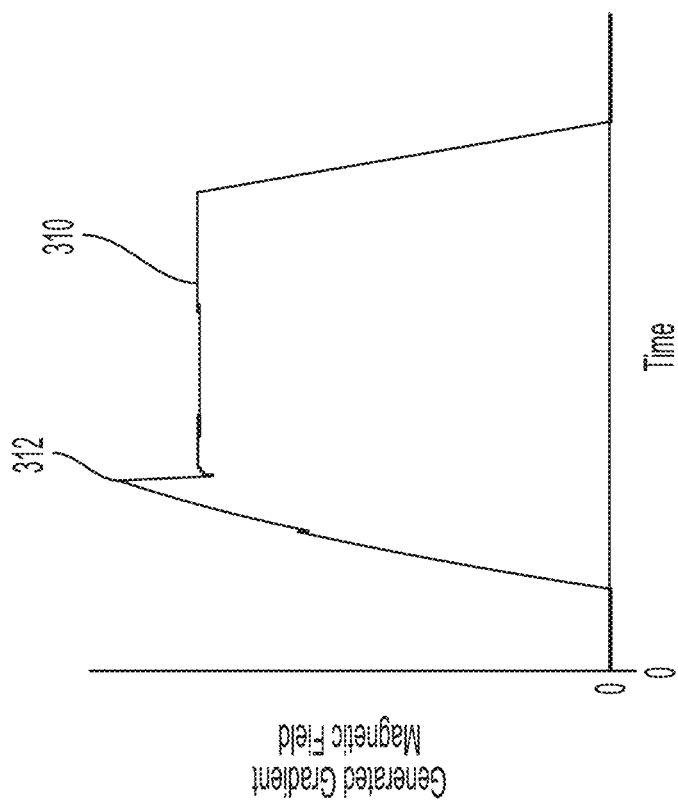
FIG. 3D is a plot of the strength of the gradient magnetic field generated by a low-field MRI system using the gradient waveform of FIG. 3A.
Figure 3C:
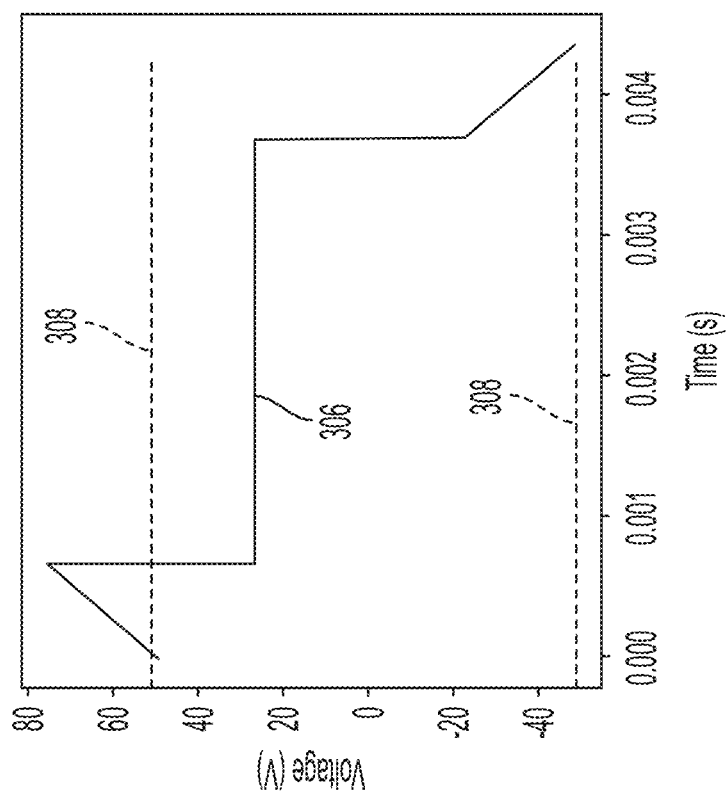
FIG. 3C is a plot of the voltage output of the gradient power amplifiers of a low-field MRI system when driving at least one gradient coil of the low-field MRI system using the gradient waveform of FIG. 3A.

FIG. 3C shows the corresponding GPA voltage 306 for the gradient waveform 302. Exemplary voltage limits 308 are shown for a low-field MRI system, and the GPA voltage 306 exceeds these voltage limits 308 during the ramp-up portion of the gradient waveform 302. Accordingly, the gradient magnetic field 310, as shown in FIG. 3D, exhibits an overshoot 312 where the GPA voltage 306 exceeds the voltage limits 308. This overshoot 312 is undesirable as it leads to unpredictable spikes in the generated gradient magnetic field during MRI imaging.

Figure 4A:
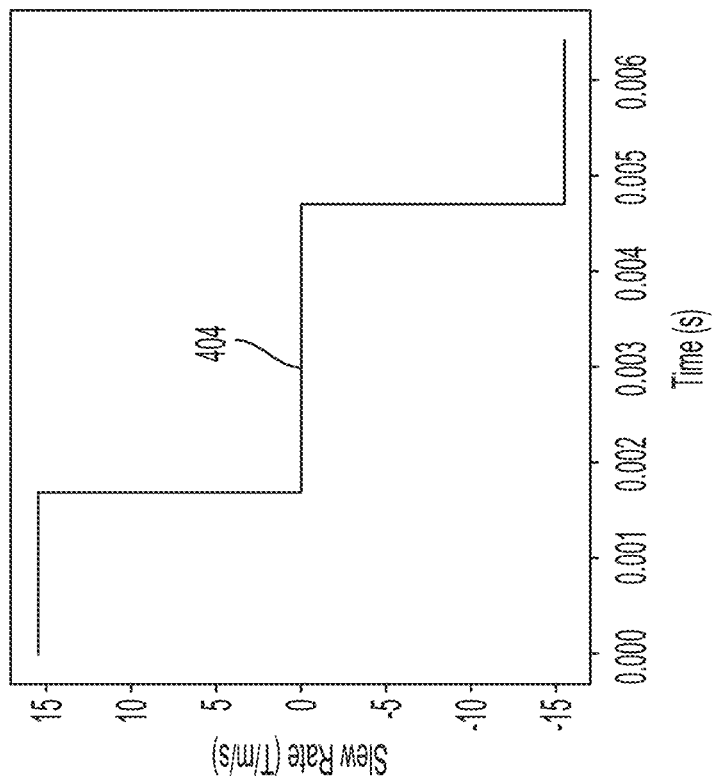
FIG. 4A is a plot of an illustrative gradient waveform including a trapezoidal gradient pulse having longer linear ramp-up and ramp-down portions.
Figure 4B:
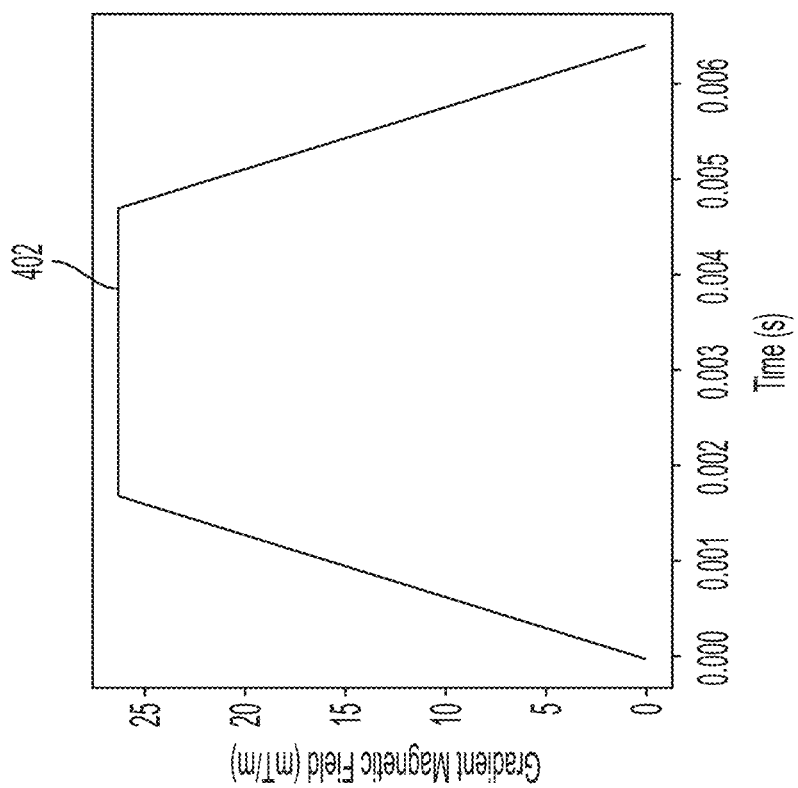
FIG. 4B is a plot of a magnetic slew rate corresponding to the gradient waveform of FIG. 4A.
Figure 4C:
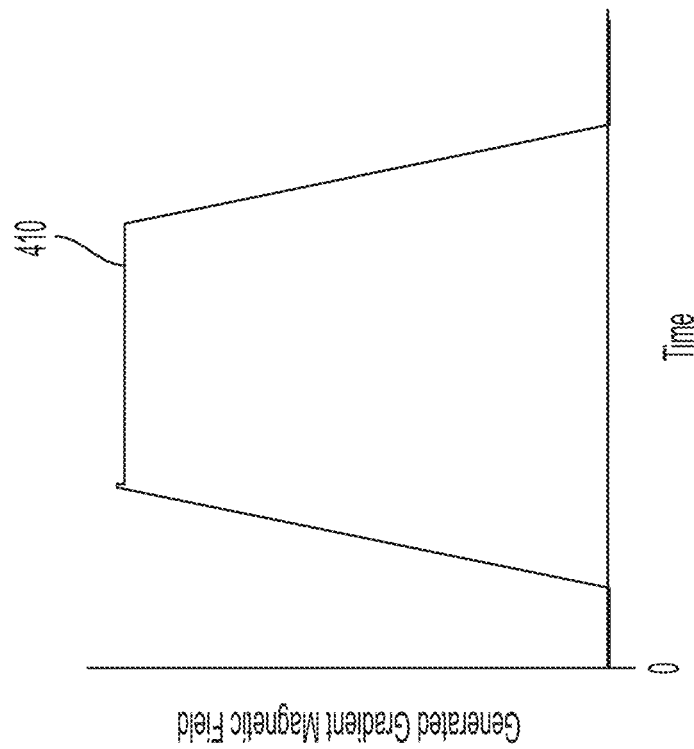
FIG. 4C is a plot of the voltage output of the gradient power amplifiers of a low-field MRI system when driving at least one gradient coil of the low-field MRI system using the gradient waveform of FIG. 4A.
Figure 4D:
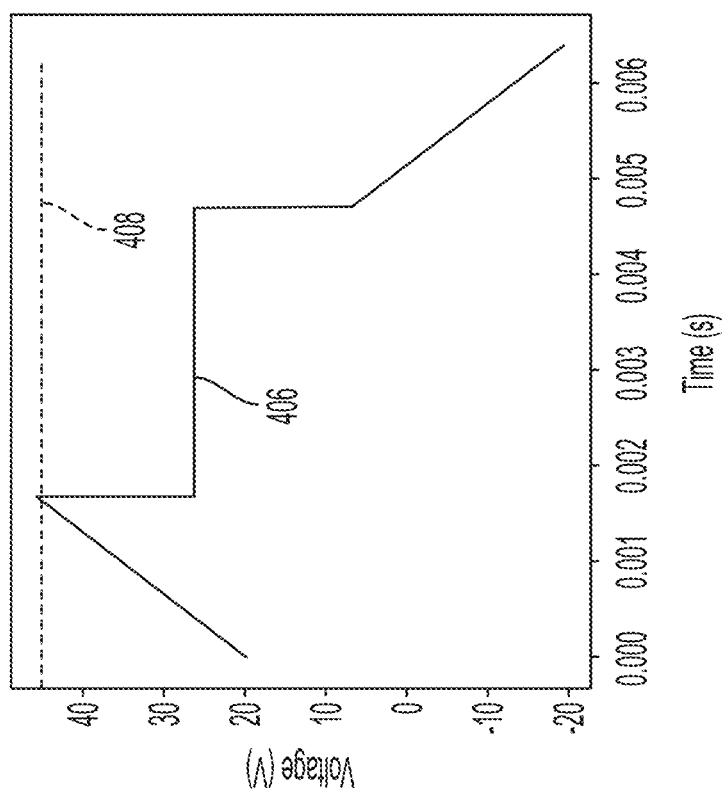
FIG. 4D is a plot of the strength of the gradient magnetic field generated by a low-field MRI system using the gradient waveform of FIG. 4A.

One solution to the problem illustrated by FIGS. 3A-3D is to reduce the slew rate of the gradient waveform (e.g., by lengthening the ramp-up and ramp-down portions of the gradient waveform). FIG. 4A illustrates a gradient waveform 402 having longer ramp-up and ramp-down portions. The corresponding slew rate 404 is shown in FIG. 4B, and the corresponding GPA voltage 406 is shown in FIG. 4C. As shown in FIG. 4C, the GPA voltage 406 approaches the voltage limit 408 but does not exceed the voltage limit 408 as dramatically as the example of FIG. 3C. Accordingly, the gradient magnetic field 410, shown in FIG. 4D, does not exhibit such a large overshoot as in the example of FIG. 3D. However, the gradient magnetic field 410 does exhibit a shorter length of time spent at the maximum gradient magnetic field output. This corresponds to a reduced time spent acquiring magnetic resonance (MR) data and accordingly a reduced signal-to-noise ratio (SNR) in the acquired MR images. The time-inefficient solution of FIGS. 4A-4D is therefore not ideal for low-field MRI where maximizing SNR is important in light of the reduced field strength of the low-field MRI system.

The inventors have appreciated that imposing hardware constraints on the gradient waveform can mitigate the problems described in connection with the examples of FIGS. 3A-3D and FIGS. 4A-4D. The voltage in the gradient coil due to an applied current, $I_g$, can be expressed in terms of the gradient coil's resistance R and inductance L. There are two sources of voltage in the gradient coil. The first source of voltage is due to resistive dissipation and is described by Ohm's law:

$$V_1 = RI_g$$

The second source of voltage is due to self-induction and is described by Faraday's law:

$$V_2 = L\dfrac{dI_g}{dt}$$

To remain within the hardware limitations of the low-field MRI system (e.g., the voltage limitations of the GPAs), the total voltage within the gradient coil during operation should be less than the maximum available voltage output of the GPAs, denoted as $V_{max}$:

$$|V_1 + V_2| < V_{max}$$

$$\left|RI_g + L\dfrac{dI_g}{dt}\right| < V_{max}$$

Since the gradient magnetic field, g, is proportional to the current in the gradient coil, $I_g$, such that $g=\alpha I_g$, where a is the gradient coil efficiency in mT/m/A, this above expression can be refactored to describe a limitation on the maximum slew rate available within the hardware constraints of the low-field MRI system:

$$\left|\dfrac{dg}{dt} + \dfrac{g}{\tau}\right| < S_{max},$$

where τ is a time constant given by τ=L/R and $S_{max}$ is the maximum slew rate given by $S_{max}=\alpha V_{max}/L$. This expression provides a voltage limit constraint on the design of gradient waveforms for use with low-field MRI systems.

An additional hardware constraint imposed by the GPAs of the low-field MRI system includes a current limit constraint. The current in the gradient coil should be less than a maximum current produced by the GPAs:

$$|I_g| < I_{max}$$

Because the gradient magnetic field is proportional to the current in the gradient coil, $I_g$, this current limit constraint also constrains the maximum gradient magnetic field that may be generated by the gradient coil:

$$|g| < g_{max}$$

A gradient waveform may then be generated using these expressions:

$$\begin{cases} |g| < g_{max} \\ \left| \frac{dg}{dt} + \frac{g}{\tau} \right| < S_{max} \end{cases}$$

This optimization problem more faithfully represents the hardware limitations of a low-field MRI system by incorporating the hardware constraints (e.g., the maximum voltage output of the GPA, the maximum slew rate of the gradient coil, the resistance of the gradient coil, and/or the inductance of the gradient coil) into the gradient waveform design process. Accordingly, during operation of the low-field MRI system, the generated magnetic field is not adversely affected by the hardware constraints of the low-field MRI system (e.g., in the form of a voltage overshoot or gradient magnetic field distortion, shortened gradient pulse, etc.).

In some embodiments, determining the gradient waveform may include solving the above differential equation. For some gradient waveforms, the differential equation may be solved numerically. Alternatively, for some gradient waveforms, the differential equation may be solved explicitly. For example, when the gradient waveform is trapezoidal, the above differential equation may be solved explicitly to describe the ramp-up and ramp-down portions of the gradient waveform. Solving this differential equation for the ramp-up portion of the trapezoidal gradient waveform, ramping up from g=0 to g=$g_{max}$, yields:

$$g_{up}(t) = \tau S_{max} \left( 1 - e^{-\frac{t}{\tau}} \right)$$

Similarly, solving this differential equation for the ramp-down portion of the trapezoidal gradient waveform, ramping down from g=$g_{max}$ to g=0, yields:

$$g_{down}(t) = -\tau S_{max} + (g_{max} + \tau S_{max}) e^{-\frac{t}{\tau}}$$

It should be appreciated that for both the ramp-up and ramp-down portions of the trapezoidal gradient waveform, the gradient magnetic field and the slew rate are both nonlinear in form. It should also be appreciated that the above-described method may be applied to any suitable gradient waveform, not only trapezoidal gradient waveforms. For example, the above-described method may be applied to square gradient waveforms and/or gradient waveforms associated with a spiral k-space trajectory.

Figure 5:
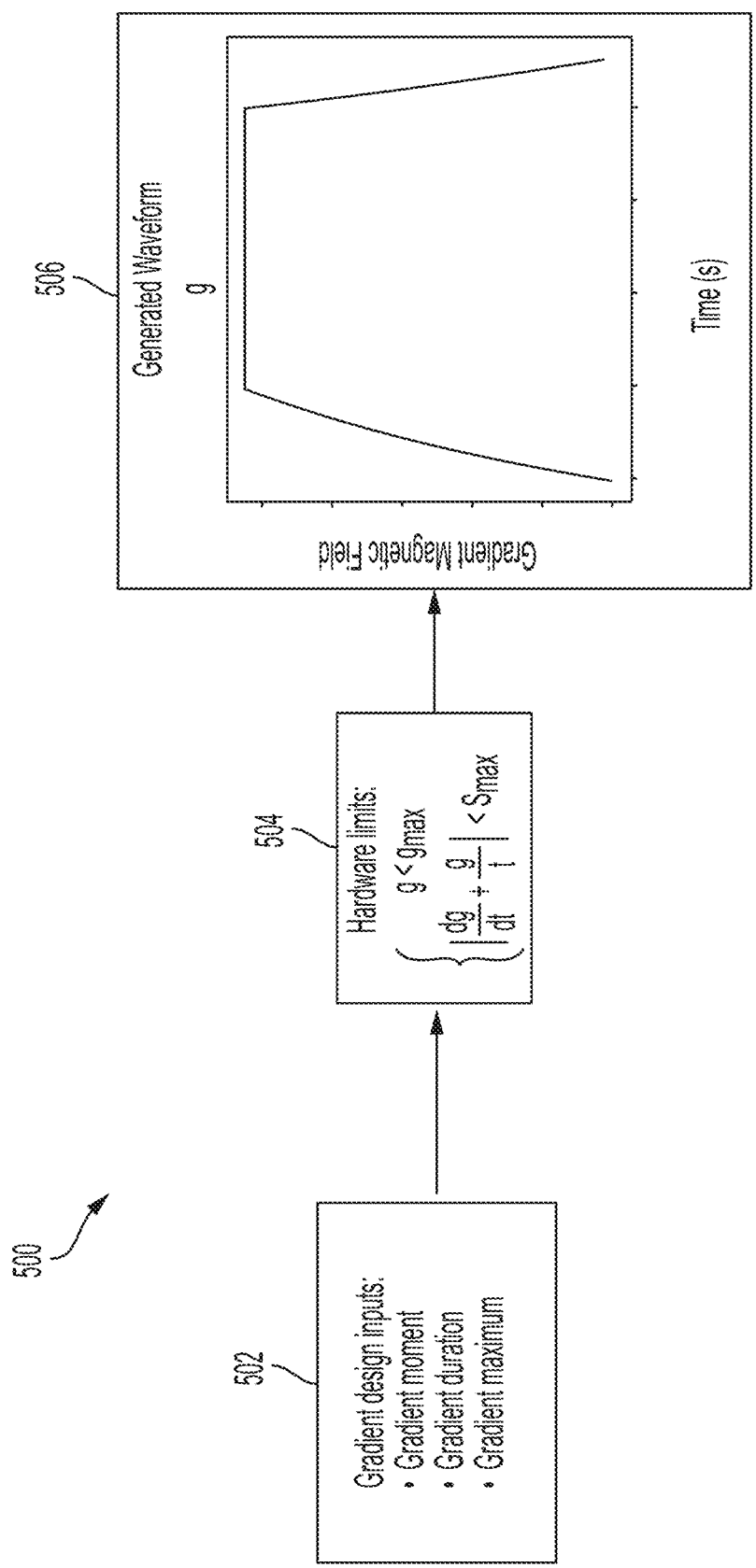
FIG. 5 is a flowchart illustrating a process 500 for generating a gradient waveform, in accordance with some embodiments of the technology described herein.

FIG. 5 is a flowchart describing a process 500 for generating a gradient waveform for use by a low-field MRI system to generate a gradient magnetic field, in accordance with some embodiments of the technology described herein. Process 500 may be executed using any suitable computing device. For example, in some embodiments, the process 500 may be performed by a computing device co-located with the low-field MRI system (e.g., in a same room as the low-field MRI system, physically coupled to the low-field MRI system, etc.). As another example, in some embodiments, the process 500 may be performed by one or more processors located on the low-field MRI system. Alternatively, in some embodiments, the process 500 may be performed by one or more processors located remotely from the low-field MRI system (e.g., as part of a cloud computing environment).

In some embodiments, process 500 imposes the hardware constraints 504 described above on information indicative of the gradient waveform 502 (e.g., gradient waveform parameters) to generate the gradient waveform 506. In some embodiments, the information indicative of the gradient waveform 502 includes gradient waveform parameters as shown in the example of FIG. 5. The gradient waveform parameters may include the gradient field moment, the gradient field duration, and/or the maximum value of the gradient field strength. In some embodiments, the information indicative of the gradient waveform 502 may be a pre-determined gradient waveform having specified parameters such as a specified moment, duration, and/or maximum value of the gradient magnetic field.

In some embodiments, imposing the hardware constraints 504 on the information indicative of the gradient waveform 502 may be performed using a differential equation, as described herein. The hardware constraints 504 may include the maximum voltage output of the GPA, the maximum slew rate of the gradient coil, the resistance of the gradient coil, the inductance of the gradient coil, and/or a ratio of the resistance and inductive of the gradient coil and may be described by the differential equation.

By imposing the hardware constraints 504 on the information indicative of the gradient waveform 502, and gradient waveform 506 may be determined and/or generated. In some embodiments, the gradient waveform 506 may be determined by solving the differential equation subject to the hardware constraints 504 (e.g., solving the different equation explicitly or numerically).

In the example of FIG. 5, the generated gradient waveform 506 is a trapezoidal gradient waveform and includes non-linear ramp-up and ramp-down portions. The gradient waveform 506 does not exhibit distortions (e.g., due to voltage overshoot of the GPA). Additionally, the top portion connecting the ramp-up and ramp-down portions is longer (e.g., spanning a longer period of time) than the corresponding top portion of the example of FIG. 4A, enabling comparatively improved MR signal acquisition. It should be appreciated that while the example of FIG. 5 shows process 500 applied to a trapezoidal gradient waveform, the process 500 need not only apply to trapezoidal gradient waveforms. Rather, process 500 may be applied to any gradient waveform for use by a low-field MRI system to generate a gradient magnetic field. For example, the gradient waveform may be a square gradient waveform or a gradient waveform associated with a spiral k-space trajectory rather than a trapezoidal gradient waveform.

Figure 6D:
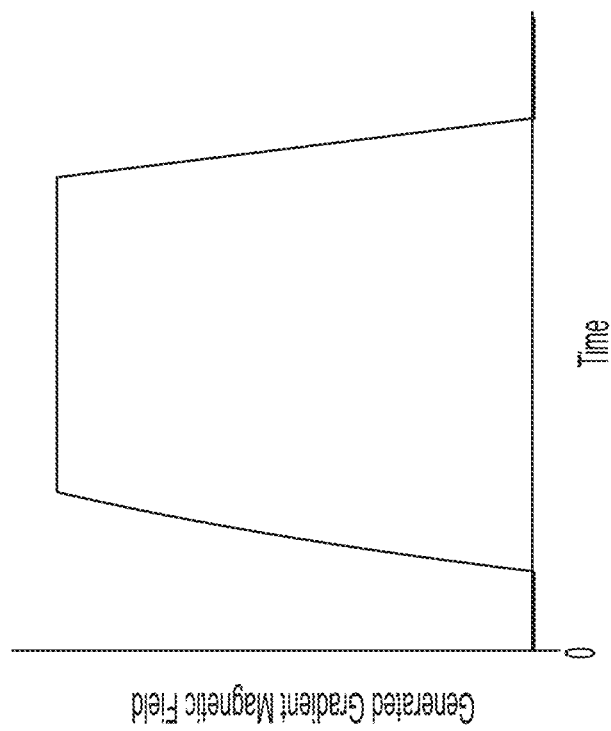
FIG. 6D is a plot of the strength of the gradient magnetic field generated by a low-field MRI system using the gradient waveform of FIG. 6A, in accordance with some embodiments of the technology described herein.
Figure 6C:
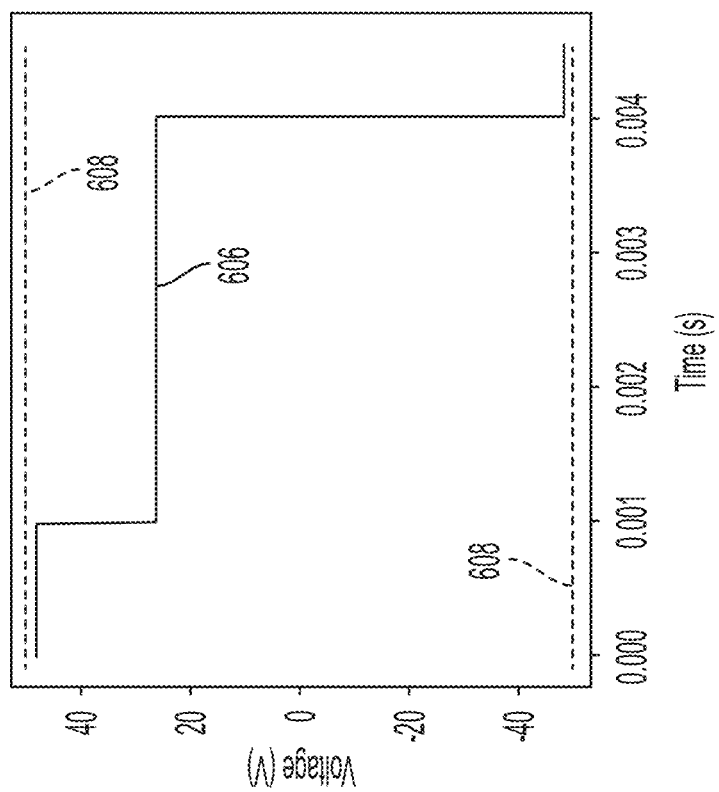
FIG. 6C is a plot of the voltage output of the gradient power amplifiers of a low-field MRI system when driving at least one gradient coil of the low-field MRI system using the gradient waveform of FIG. 6A, in accordance with some embodiments of the technology described herein.

FIG. 6A illustrates a gradient waveform 602 generated using process 500. The gradient waveform 602 is a trapezoidal gradient waveform that includes a ramp-up portion 602a, a top portion 602b, and a ramp-down portion 602c. The corresponding slew rate 604 and GPA voltage 606 are shown in FIGS. 6B and 6C, respectively. The ramp-up portion 602a and the ramp-down portion 602c generated using process 500 are both non-linear, as are the corresponding portions of the slew rate 604. Additionally, the GPA voltage 606 remains within the voltage limits 608 for both the ramp-up portion 602a and the ramp-down portion 602c of the gradient waveform. Accordingly, the gradient magnetic field 610, shown in FIG. 6D, exhibits no distortions (e.g., overshoots) relative to the gradient waveform 602 while still ramping up and down quickly.

Figure 7:
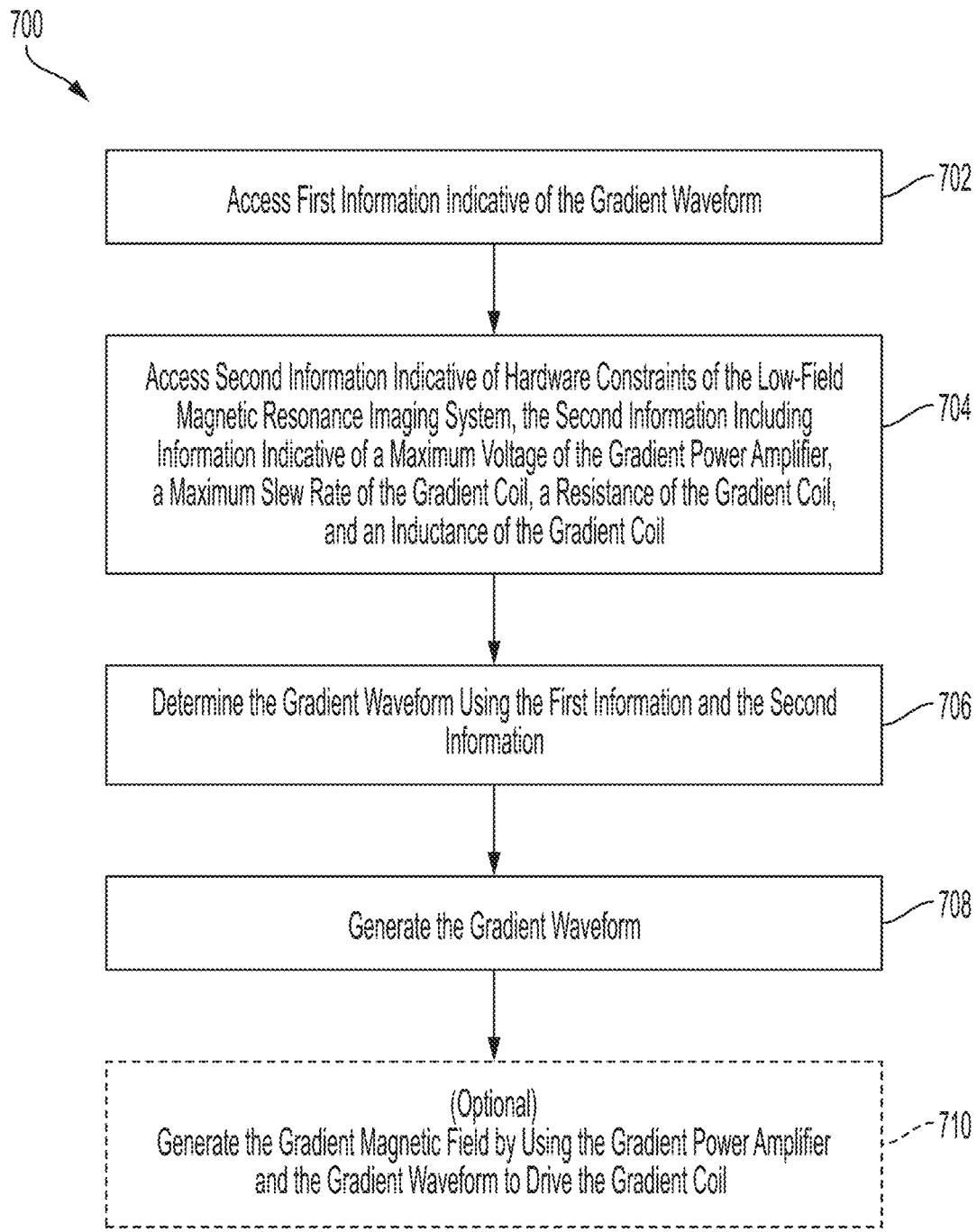
FIG. 7 is a flowchart of an illustrative process 700 of generating a gradient waveform for use by a low-field MRI system to generate a gradient magnetic field, in accordance with some embodiments of the technology described herein.

FIG. 7 is a flowchart of a process 700 of generating a gradient waveform for use by a low-field MRI system to generate a gradient magnetic field, in accordance with some embodiments of the technology described herein. Process 700 may be executed using any suitable computing device. For example, in some embodiments, the process 700 may be performed by a computing device co-located with the low-field MRI system (e.g., in a same room as the low-field MRI system, physically coupled to the low-field MRI system, etc.). As another example, in some embodiments, the process 700 may be performed by one or more processors located on the low-field MRI system. Alternatively, in some embodiments, the process 700 may be performed by one or more processors located remotely from the low-field MRI system (e.g., as part of a cloud computing environment).

Process 700 begins at act 702, where the computing device accesses first information indicative of the gradient waveform. In some embodiments, the first information indicative of the gradient waveform includes parameters of the gradient waveform. For example, the parameters may include a moment of the gradient magnetic field, a duration of the gradient magnetic field, and/or a maximum value of the gradient magnetic field. Alternatively, the information indicative of the gradient waveform may be a pre-determined gradient waveform having specified parameters such as a specified moment, duration, and/or maximum value of the gradient magnetic field to be generated.

After act 702, process 700 proceeds to act 704, where the computing device accesses second information indicative of hardware constraints of the low-field MRI system. In some embodiments, the second information includes information indicative of a maximum voltage of the GPA of the low-field MRI system, a maximum slew rate of the gradient coil, a resistance of the gradient coil, and/or an inductance of the gradient coil. In some embodiments, the maximum slew rate has a magnitude in a range from 25 T/m/s to 65 T/m/s. In some embodiments, the maximum voltage of the gradient power amplifier has a magnitude in a range from 40 V to 60 V.

In some embodiments, accessing the first information indicative of the gradient waveform and/or the second information indicative of hardware constraints of the low-field MRI system is performed by accessing stored information. For example, the computing device may access the first and/or second information from local computer memory and/or remote computer memory (e.g., from a cloud computing environment). Alternatively, the computing device may access the first information and/or the second information by receiving some or all of the information. For example, the first information and/or the second information may be transmitted to the computing device and/or input by a user.

After act 704, process 700 proceeds to act 706, where the gradient waveform is determined using the first information and the second information. In some embodiments, determining the gradient waveform includes determining gradient waveform parameters subject to hardware constraints specified using a differential equation, as described herein. The differential equation may be specified in part using the second information indicative of the hardware constraints of the low-field MRI system. In some embodiments, determining the gradient waveform comprises solving the differential equation, either explicitly or numerically.

In some embodiments, after determining the gradient waveform in act 704, the method also includes rotating a frame of reference of the gradient waveform. Rotating the frame of reference of the gradient waveform may be performed to match a frame of reference of the low-field MRI system and/or the subject (e.g., the patient) being imaged by the low-field MRI system. Rotating the frame of reference of the gradient waveform may be performed, for example, by applying a rotation operator (e.g., a rotation matrix) to the gradient waveform.

After act 706, process 700 proceeds to act 708, where the gradient waveform is generated. In some embodiments, the computing device may generate the gradient waveform by generating information specifying parameters of the gradient waveform. Alternatively or additionally, the computing device may generate the gradient waveform by generating an electronic signal according to the determined parameters of the gradient waveform. It should be appreciated that the gradient waveform may be any suitable gradient waveform for use by an MRI system to generate a gradient magnetic field (e.g., a trapezoidal gradient waveform, a square gradient waveform, a gradient waveform associated with a spiral k-space trajectory, etc.).

After act 708, process 700 optionally proceeds to act 710. In act 710, a gradient magnetic field may be generated using the gradient waveform and a GPA to drive a gradient coil. For example, the generated gradient magnetic field may be generated as a part of a pulse sequence for acquiring an MR image of a subject.

Figure 8:
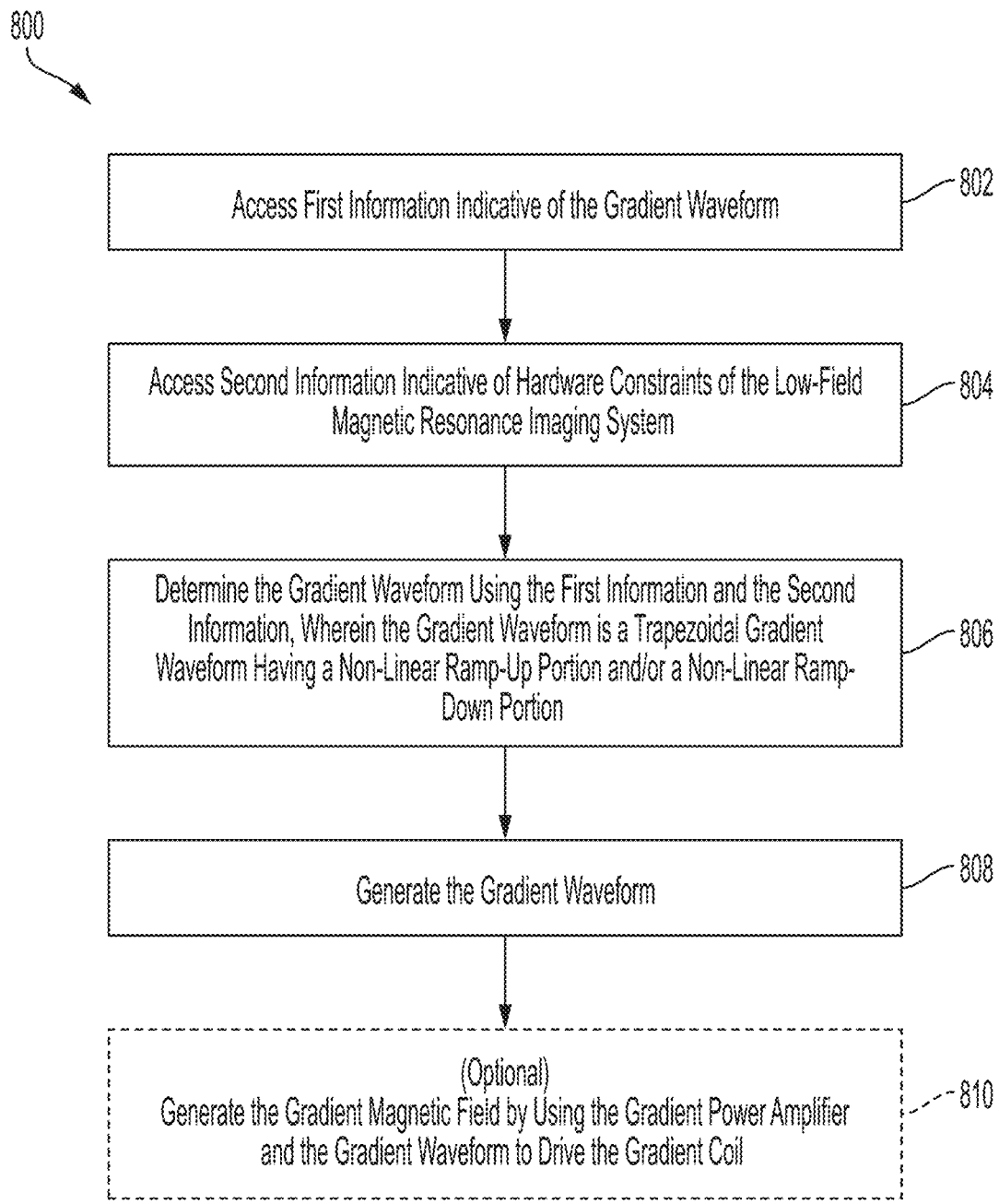
FIG. 8 is a flowchart of an illustrative process 800 of generating a trapezoidal gradient waveform for use by a low-field MRI system to generate a gradient magnetic field, the trapezoidal gradient waveform having a non-linear ramp-up portion and/or a non-linear ramp-down portion, in accordance with some embodiments of the technology described herein.

FIG. 8 is a flowchart of a process 800 of generating a trapezoidal gradient waveform for use by a low-field MRI system to generate a gradient magnetic field, the trapezoidal gradient waveform having a non-linear ramp-up portion and/or a non-linear ramp-down portion, in accordance with some embodiments of the technology described herein. Process 800 may be executed using any suitable computing device. For example, in some embodiments, the process 800 may be performed by a computing device co-located with the low-field MRI system (e.g., in a same room as the low-field MRI system, physically coupled to the low-field MRI system, etc.). As another example, in some embodiments, the process 800 may be performed by one or more processors located on the low-field MRI system. Alternatively, in some embodiments, the process 800 may be performed by one or more processors located remotely from the low-field MRI system (e.g., as part of a cloud computing environment).

Process 800 begins at act 802, where the computing device accesses first information indicative of the gradient waveform. In some embodiments, the first information indicative of the gradient waveform includes parameters of the gradient waveform. For example, the parameters may include a moment of the gradient magnetic field, a duration of the gradient magnetic field, and/or a maximum value of the gradient magnetic field. Alternatively, the information indicative of the gradient waveform may be a pre-determined gradient waveform having specified parameters such as a specified moment, duration, and/or maximum value of the gradient magnetic field to be generated.

After act 802, process 800 proceeds to act 804, where the computing device accesses second information indicative of hardware constraints of the low-field MRI system. In some embodiments, the second information includes information indicative of a maximum voltage of the GPA of the low-field MRI system, a maximum slew rate of the gradient coil, a resistance of the gradient coil, and/or an inductance of the gradient coil. In some embodiments, the maximum slew rate has a magnitude in a range from 25 T/m/s to 65 T/m/s. In some embodiments, the maximum voltage of the gradient power amplifier has a magnitude in a range from 40 V to 60 V.

After act 804, process 800 may proceed to act 806, where the computing device may determine the gradient waveform using the first information and the second information. The gradient waveform may be a trapezoidal gradient waveform having a non-linear ramp-up and/or non-linear ramp-down portion. Accordingly, determining the gradient waveform may include determining a shape of the ramp-up portion and/or the ramp-down portion using the first information indicative of the gradient waveform and the second information indicative of the hardware constraints of the low-field MRI system.

In some embodiments, determining the shape of the ramp-up portion and/or the ramp-down portion of the gradient waveform includes determining gradient waveform parameters subject to hardware constraints specified using a differential equation, as described herein. The differential equation may be specified in part using the second information indicative of the hardware constraints of the low-field MRI system. In some embodiments, determining the gradient waveform comprises solving the differential equation, either explicitly or numerically.

In some embodiments, after determining the gradient waveform in act 804, the method also includes rotating a frame of reference of the gradient waveform. Rotating the frame of reference of the gradient waveform may be performed to match a frame of reference of the low-field MRI system and/or the subject (e.g., the patient) being imaged by the low-field MRI system. Rotating the frame of reference of the gradient waveform may be performed, for example, by applying a rotation operator (e.g., a rotation matrix) to the gradient waveform.

After act 806, process 800 proceeds to act 808, where the computing device generates the gradient waveform. In some embodiments, the computing device may generate the gradient waveform by generating information specifying parameters of the gradient waveform. Alternatively or additionally, the computing device may generate the gradient waveform by generating an electronic signal according to the determined parameters of the gradient waveform.

After act 808, process 800 optionally proceeds to act 810. In act 810, a gradient magnetic field is generated using the gradient waveform and a GPA to drive a gradient coil. For example, the generated gradient magnetic field may be generated as a part of a pulse sequence for acquiring an MR image of a subject.

Figure 9A:
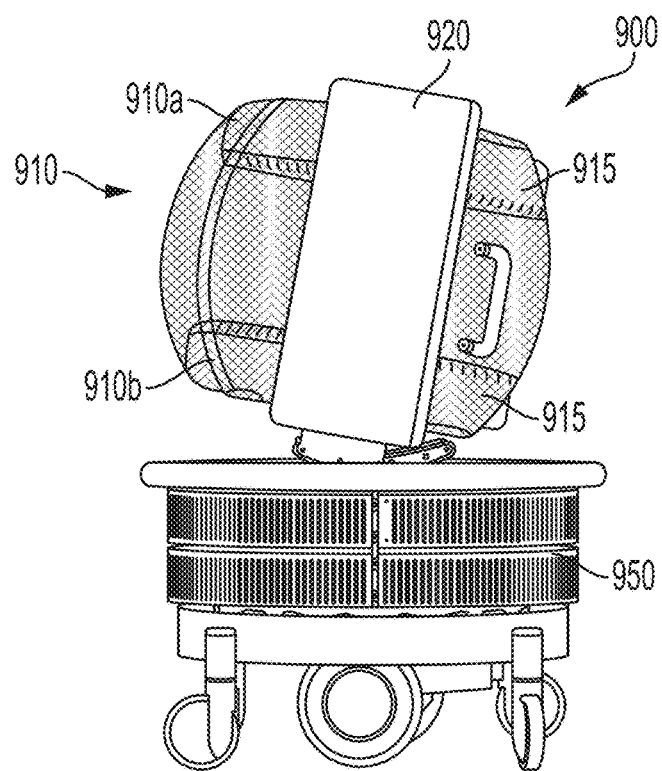
FIGS. 9A and 9B illustrate views of a low-field MRI system, in accordance with some embodiments of the technology described herein.
Figure 9B:
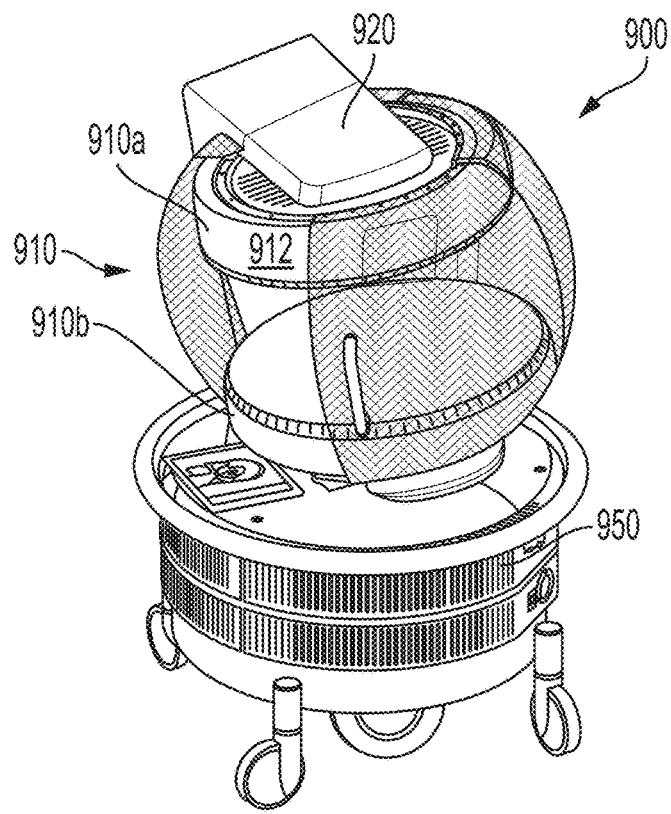

FIGS. 9A and 9B illustrate views of a portable, low-field MRI system 900, in accordance with some embodiments. Low-field MRI system 900 comprises a $B_0$ magnet 910 formed in part by an upper magnet 910a and a lower magnet 910b having a yoke 920 coupled thereto to increase the flux density within the imaging region. The $B_0$ magnet 910 may be housed in magnet housing 912 along with gradient coils 915 (e.g., any of the gradient coils described in U.S. Pat. No. 9,817,093, titled "Low Field Magnetic Resonance Imaging Methods and Apparatus" and filed on Sep. 4, 2015, which is herein incorporated by reference in its entirety). According to some embodiments, $B_0$ magnet 910 comprises an electromagnet. According to some embodiments, $B_0$ magnet 910 comprises a permanent magnet.

Figure 10:
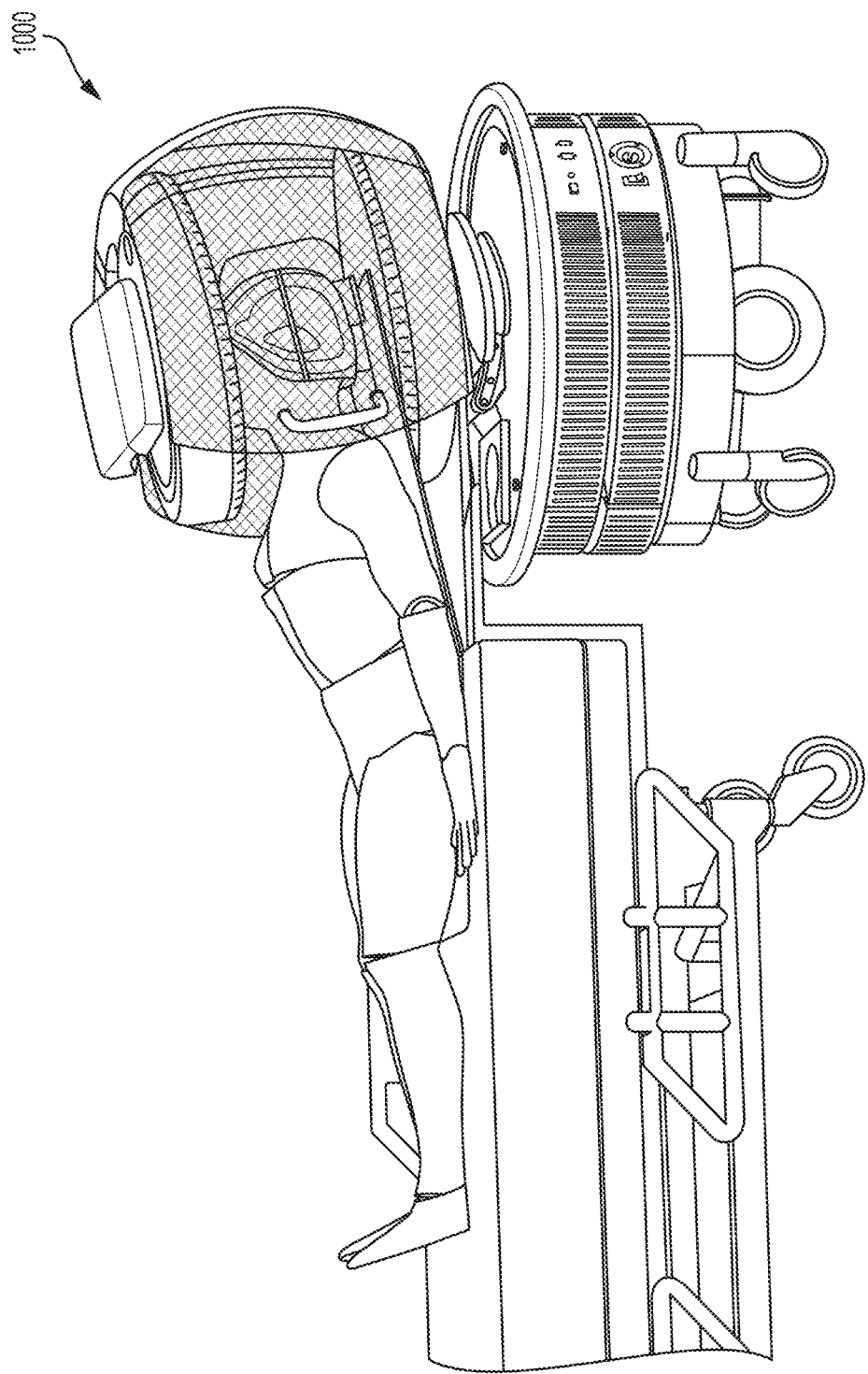
FIG. 10 illustrates a low-field MRI system performing a scan of a patient's head, in accordance with some embodiments of the technology described herein.

Low-field MRI system 900 further comprises a base 950 housing the electronics needed to operate the MRI system. For example, base 950 may house electronics including power components configured to operate the low-field MRI system using mains electricity (e.g., via a connection to a standard wall outlet and/or a large appliance outlet). Accordingly, low-field MRI system 900 can be brought to the patient and plugged into a wall outlet in the vicinity. In this manner, low-field MRI system 900 can be transported to the patient and maneuvered to the bedside to perform imaging, as illustrated in FIG. 10. For example, FIG. 10 illustrates a low-field MRI system 1000 that has been transported to a patient's bedside to perform a brain scan.

Figure 11:
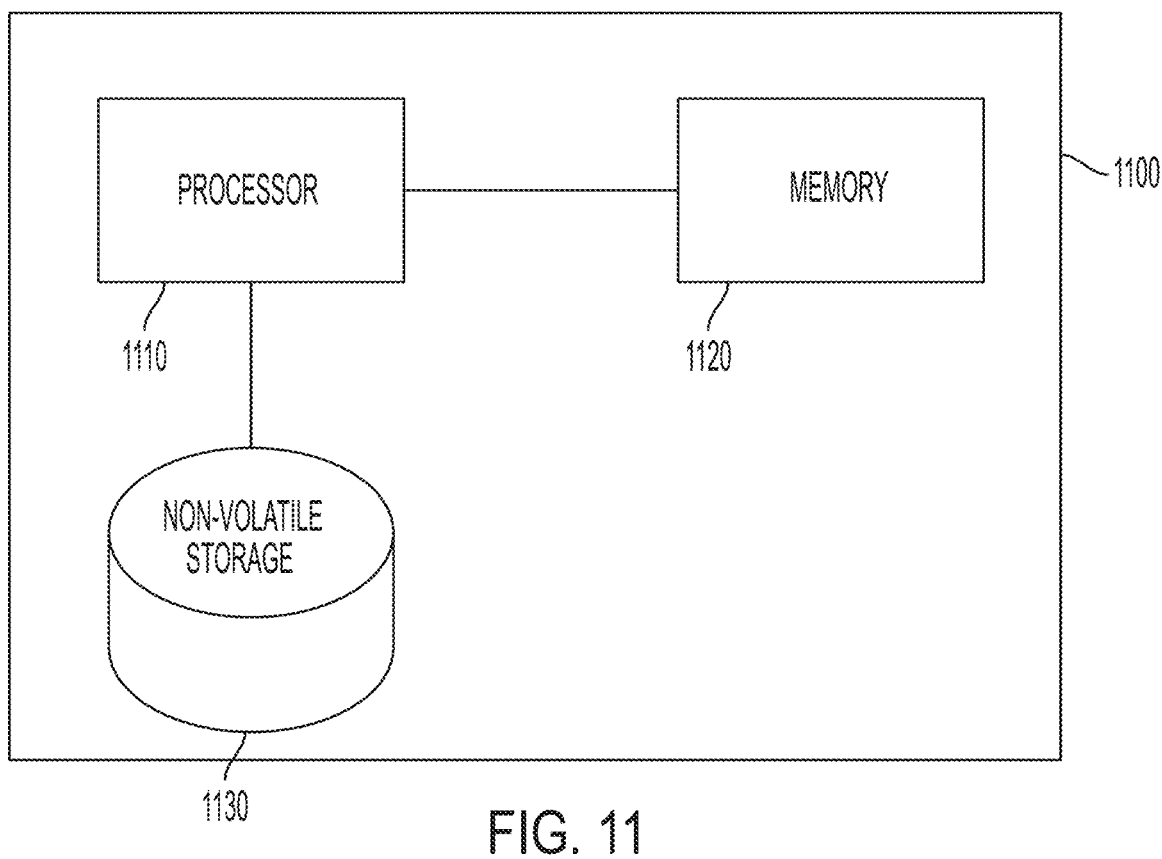
FIG. 11 is a diagram of an illustrative computer system on which embodiments described herein may be implemented.

FIG. 11 is a diagram of an illustrative computer system on which embodiments described herein may be implemented. An illustrative implementation of a computer system 1100 that may be used in connection with any of the embodiments of the disclosure provided herein is shown in FIG. 11. For example, the processes described with reference to FIGS. 5, 7, and 8 may be implemented on and/or using computer system 1100. The computer system 1100 may include one or more processors 1110 and one or more articles of manufacture that comprise non-transitory computer-readable storage media (e.g., memory 1120 and one or more non-volatile storage media 1130). The processor 1110 may control writing data to and reading data from the memory 1120 and the non-volatile storage device 1130 in any suitable manner, as the aspects of the disclosure provided herein are not limited in this respect. To perform any of the functionality described herein, the processor 1110 may execute one or more processor-executable instructions stored in one or more non-transitory computer-readable storage media (e.g., the memory 1120), which may serve as non-transitory computer-readable storage media storing processor-executable instructions for execution by the processor 1110.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize or be able to ascertain using no more than routine experimentation many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone, a tablet, or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, within ±2% of a target value in some embodiments. The terms "approximately" and "about" may include the target value.

What is claimed is:

1. A method of generating a gradient waveform for use by a low-field magnetic resonance imaging (MRI) system to generate a gradient magnetic field, the low-field MRI system comprising a gradient coil and a gradient power amplifier for driving the gradient coil, the method comprising:
  accessing first information indicative of the gradient waveform;
  accessing second information indicative of hardware constraints of the low-field MRI system;
  determining the gradient waveform using the first information and the second information, wherein the gradient waveform is a trapezoidal gradient waveform having a non-linear ramp-up portion and/or a non-linear ramp-down portion; and
  generating the gradient waveform.

2. The method of claim 1, further comprising generating the gradient magnetic field by using the gradient power amplifier and the gradient waveform to drive the gradient coil.

3. The method of claim 1, wherein determining the gradient waveform comprises determining a shape of the ramp-up portion and/or the ramp-down portion using the first information and the second information.

4. The method of claim 1, wherein determining the gradient waveform comprises determining gradient waveform parameters subject to hardware constraints specified using a differential equation, the differential equation specified in part using the second information.

5. The method of claim 1, wherein accessing the first information comprises accessing information including a moment of the gradient magnetic field, a duration of the gradient magnetic field, and/or a maximum value of the gradient magnetic field.

6. The method of claim 1, wherein accessing the first information comprises accessing a pre-determined gradient waveform.

7. The method of claim 1, wherein accessing the second information comprises accessing information indicative of a maximum voltage of the gradient power amplifier, a maximum slew rate of the gradient coil, a resistance of the gradient coil, and an inductance of the gradient coil.

8. The method of claim 7, wherein the maximum slew rate has a magnitude in a range from 10 T/m/s to 80 T/m/s.

9. The method of claim 7, wherein the maximum slew rate has a magnitude in a range from 25 T/m/s to 65 T/m/s.

10. The method of claim 7, wherein the maximum voltage of the gradient power amplifier has a magnitude in a range from 20 V to 120 V.

11. The method of claim 7, wherein the maximum voltage of the gradient power amplifier has a magnitude in a range from 40 V to 60 V.

12. The method of claim 1, further comprising:
  after determining the gradient waveform, rotating a frame of reference of the gradient waveform to match a frame of reference of the low-field MRI system.

13. The method of claim 1, wherein the low-field MRI system further comprises at least one permanent magnet configured to generate a $B_0$ magnetic field having a strength less than 0.2 T.

14. The method of claim 1, wherein the low-field MRI system further comprises at least one permanent magnet configured to generate a $B_0$ magnetic field having a strength in a range from 50 mT to 0.1 T.

15. At least one non-transitory computer-readable storage medium storing processor-executable instructions that, when executed by a low-field magnetic resonance imaging (MRI) system, cause the low-field MRI system to perform a method of generating a gradient waveform for use by the low-field MRI system to generate a gradient magnetic field, the low-field MRI system comprising a gradient coil and a gradient power amplifier for driving the gradient coil, the method comprising:
  accessing first information indicative of the gradient waveform;
  accessing second information indicative of hardware constraints of the low-field MRI system;
  determining the gradient waveform using the first information and the second information, wherein the gradient waveform is a trapezoidal gradient waveform having a non-linear ramp-up portion and/or a non-linear ramp-down portion; and
  generating the gradient waveform.

16. The at least one non-transitory computer-readable storage medium of claim 15, wherein determining the gradient waveform comprises determining a shape of the ramp-up portion and/or the ramp-down portion using the first information and the second information.

17. The at least one non-transitory computer-readable storage medium of claim 15, wherein determining the gradient waveform comprises determining gradient waveform parameters subject to hardware constraints specified using a differential equation, the differential equation specified in part using the second information.

18. A low-field magnetic resonance imaging (MRI) system, comprising:
  a magnetics system comprising a plurality of magnetics components configured to produce magnetic fields for performing magnetic resonance imaging, the plurality of magnetics components comprising a gradient coil and a gradient power amplifier for driving the gradient coil; and
  at least one controller configured to operate one or more of the plurality of magnetics components, wherein the at least one controller is configured to:
    access first information indicative of a gradient waveform;
    access second information indicative of hardware constraints of the low-field MRI system;
    determine the gradient waveform using the first information and the second information, wherein the gradient waveform is a trapezoidal gradient waveform having a non-linear ramp-up portion and/or a non-linear ramp-down portion; and
    generate the gradient waveform.

19. The low-field MRI system of claim 18, wherein the magnetics system comprises at least one permanent magnet configured to generate a $B_0$ magnetic field having a strength less than 0.2 T.

20. The low-field MRI system of claim 18, wherein the magnetics system further comprises at least one permanent magnet configured to generate a $B_0$ magnetic field having a strength in a range from 50 mT to 0.1 T.

* * * * *